United States Patent
Lee et al.

(10) Patent No.: US 7,381,353 B2
(45) Date of Patent: *Jun. 3, 2008

(54) BLACK CONDUCTIVE THICK FILM COMPOSITIONS, BLACK ELECTRODES, AND METHODS OF FORMING THEREOF

(75) Inventors: Ji-Yeon Lee, Kanakawa-Ken (JP); Michael F. Barker, Raleigh, NC (US); Keiichiro Hayakawa, Tokyo (JP); Hisashi Matsuno, Tokyo (JP); Hiroaki Noda, Tokyo (JP); Jerome David Smith, Cary, NC (US)

(73) Assignee: E.I. du Pont de Nemours and Company, Wilmington, DE (US)

(*) Notice: Subject to any disclaimer, the term of this patent is extended or adjusted under 35 U.S.C. 154(b) by 0 days.

This patent is subject to a terminal disclaimer.

(21) Appl. No.: 11/417,469

(22) Filed: May 4, 2006

(65) Prior Publication Data

US 2006/0266984 A1 Nov. 30, 2006

Related U.S. Application Data

(63) Continuation-in-part of application No. 11/369,551, filed on Mar. 7, 2006, and a continuation-in-part of application No. 11/369,550, filed on Mar. 7, 2006, and a continuation-in-part of application No. 11/369,549, filed on Mar. 7, 2006.

(60) Provisional application No. 60/690,283, filed on Jun. 14, 2005, provisional application No. 60/660,126, filed on Mar. 9, 2005, provisional application No. 60/659,839, filed on Mar. 9, 2005, provisional application No. 60/660,013, filed on Mar. 9, 2005.

(51) Int. Cl.
H01B 1/06 (2006.01)
H01B 1/12 (2006.01)
H01B 1/02 (2006.01)
H01B 1/22 (2006.01)
G03C 1/00 (2006.01)

(52) U.S. Cl. ............... 252/511; 252/500; 252/512; 252/514; 252/518.1; 430/270.1

(58) Field of Classification Search ............ 430/231, 430/270.1; 252/500, 511, 512, 514, 518.1
See application file for complete search history.

(56) References Cited

U.S. PATENT DOCUMENTS

| | | | |
|---|---|---|---|
| 2,760,863 A | 8/1956 | Plambeck, Jr. | |
| 2,850,445 A | 9/1958 | Oster | |
| 2,875,047 A | 2/1959 | Oster | |
| 2,927,022 A | 3/1960 | Martin et al. | |
| 3,074,974 A | 1/1963 | Gebura | |
| 3,097,096 A | 7/1963 | Oster | |
| 3,097,097 A | 7/1963 | Oster et al. | |
| 3,145,104 A | 8/1964 | Oster et al. | |
| 3,380,381 A | 4/1968 | Musgrave | |
| 3,427,161 A | 2/1969 | Laridon et al. | |

(Continued)

FOREIGN PATENT DOCUMENTS

KR 380555 B * 4/2003

*Primary Examiner*—Mark Kopec
*Assistant Examiner*—Jaison Thomas

(57) ABSTRACT

This invention is directed to black conductive compositions, black electrodes made from such compositions and methods of forming such electrodes. In particular, the invention is directed to a single layer bus electrode.

4 Claims, 4 Drawing Sheets

U.S. PATENT DOCUMENTS

| | | |
|---|---|---|
| 3,479,186 A | 11/1969 | Taylor et al. |
| 3,549,367 A | 12/1970 | Chang et al. |
| 3,583,931 A | 6/1971 | Bouchard |
| 4,162,162 A | 7/1979 | Dueber |
| 5,032,490 A | 7/1991 | Nebe et al. |
| 6,054,545 A * | 4/2000 | Oshio et al. ................ 527/301 |
| 6,406,646 B1 * | 6/2002 | Lee et al. ................... 252/514 |
| 6,555,594 B1 * | 4/2003 | Fukushima et al. ........... 522/81 |
| 6,793,850 B2 * | 9/2004 | Ichikawa et al. ........... 252/511 |
| 7,214,466 B1 * | 5/2007 | Yang et al. ................ 430/198 |

* cited by examiner

BLACK CONDUCTIVE THICK FILM COMPOSITIONS, BLACK ELECTRODES, AND METHODS OF FORMING THEREOF

This application claims the benefit of U.S. Provisional Application Nos. 60/660,126 filed Mar. 9, 2005, 60/659,839 filed Mar. 9, 2005, 60/660,013 filed Mar. 9, 2005, 60/690,283 filed Jun. 14, 2005 and U.S. National patent application Ser. Nos. 11/369,549 filed Mar. 7, 2006, 11/369,550 filed Mar. 7, 2006, and 11/369,551 filed Mar. 7, 2006.

FIELD OF THE INVENTION

The present invention is directed to black conductive compositions, black electrodes made from such compositions and methods of forming such electrodes, more specifically the present invention is directed to the use of such compositions, electrodes, and methods in flat panel display applications, including alternating-current plasma display panel devices (AC PDP). The invention is further directed to AC PDP devices themselves. In particular, the invention is directed to single layer bus (SLB) electrodes, their use in flat panel display applications, and the use of particular thick film compositions in the formation of such electrodes.

BACKGROUND OF THE INVENTION

While the background of the present invention is discussed in terms of plasma display panel (PDP) applications, it is understood that the present invention is useful in flat panel display applications, in general.

The PDP typically comprises a pair of forward and backward insulation substrates arranged in opposition to each other to form a plurality of cells as display elements each defined by the insulation substrates supported with a constant interval and cell barriers arranged between the insulation substrates, two crossing electrodes disposed on internal surfaces of the insulation substrates with a dielectric layer interposed between the electrodes which cause electric discharge in a plurality of cells by application of an alternating current. Due to this application of alternating current, phosphor screens formed on the wall surface of the cell barrier emit light and display images which are passed through the transparent insulation substrate (typically called the front glass substrate or plate).

One area of concern for PDP manufacturers is display contrast, which affects the ultimate picture viewed by the consumer. To improve the display contrast, it is essential to decrease the reflection of external light from the electrodes and conductors arranged on the front glass substrate of the PDP device. This reflection decrease can be accomplished by making the electrodes and conductors black as viewed through the front plate of the display.

Furthermore, another area of concern for PDP manufacturers is environmental in nature and is the lead and cadmium contained in the prior art black conductor compositions and black electrodes of the PDP device. It is desirable to reduce and/or eliminate the lead and cadmium contained in the black conductor compositions and electrodes while still maintaining the required physical and electrical properties of the compositions and electrodes.

For example, in Japanese Kokai Patent No. HEI 10[1998]-73233 and its division Japanese Kokai Patent No. 2004-158456, light-forming black electrode compositions containing conductive particles consisting of at least one substance chosen from ruthenium oxide, ruthenium polyoxide, or their mixture and an inorganic binder, black electrodes using such compositions, plasma display panels using such black electrodes, and a method for making such a plasma display panel are disclosed. These literature references are not directed to lead-free black conductive compositions. In these references, there are no descriptions of lead-free black conductive compositions in terms of properties such as the appearance and strength of black electrodes obtained by sintering the compositions, electrical properties such as resistance, and a balance of all the properties for PDP electrodes.

Japanese Patent No. 3510761 discloses alkali-developable photocurable conductive paste compositions for plasma display panels, easily forming high-precision electrode circuits on large areas by photolithography and firing below 600° C. Such compositions contain (A) copolymer resins obtained by the addition of glycidyl acrylate and/or glycidyl methacrylate to copolymers of methyl methacrylate and methacrylic acid and/or acrylic acid; (B) photochemical polymerization initiator; (C) photopolymerizable monomer; (D) at least one conductive metal powder selected from Au, Ag, Ni, and Al; (E) glass frit; and (F) a phosphoric acid compound. In this literature, a low-melting glass frit is described using lead oxide as the preferred main component, while there are no descriptions of lead-free conductive compositions, especially black conductive compositions.

Japanese Patent No. 3541125 discloses alkali-developable curable conductive paste compositions that have adhesion to the substrate after being fired, with adhesion between layers, suppression of curling, easy formation of high-precision conductive circuit patterns in large areas by photolithography, and are especially useful for forming underlayer electrode circuits of bus electrodes formed on the front substrate of plasma display panel. These compositions consist of: (A) carboxy-group-containing resins; (B) photopolymerizable monomer; (C) photochemical polymerization initiator; (D) silanol-group-containing synthetic amorphous silica fine powder; (E) conductive powder; and if needed (F) heat-resistant black pigment; (G) glass frit; and (H) stabilizer. In particular, this literature has a description of a low-melting glass frit using lead oxide as the preferred main component, while there are no descriptions of lead-free conductive compositions, especially black conductive compositions.

Japanese Patent No. 3479463 discloses photocurable conductive compositions providing adhesion on a substrate in steps involving drying, exposure, development and firing, and resolution, satisfying the need for both a sufficient conductivity and blackness after being fired and discloses plasma display panels (PDP) with formation of the underlayer (black layer) electrode circuit using such compositions. The basic first embodiment of the compositions described in this literature contains (A) black conductive microparticles having a surface area to weight ratio larger than 20 m$^2$/g and containing at least one substance chosen from ruthenium oxide or other ruthenium compound, copper-chromium black composite oxide and copper-iron black composite oxide, (B) an organic binder, (C) a photopolymerizable monomer, and (D) a photochemical polymerization initiator. The second embodiment contains (E) inorganic fine particles in addition to the above components. In this literature, with respect to this composition, the inorganic fine particles (E) contain, as needed, glass powder with a softening point of 400-600° C., conductive powder, heat-resistant black pigment, silica powder, etc. However, in the compositions of this literature, glass powder is not an essential component, and even when a glass component is added, lead oxide is described as the preferred main component, with no disclosure of lead-free black conductive compositions.

Japanese Patent No. 3538387 discloses photocurable conductive compositions having storage stability, providing adhesion on substrates in the different steps of drying, exposure, development and firing, and resolution, and satisfying the need for both sufficient blackness after being fired, and discloses plasma display panels (PDP) with the formation of the underlayer (black layer) electrode circuit using such compositions. The basic first embodiment of these photocurable resin compositions contains (A) tricobalt tetroxide ($Co_3O_4$) black microparticles, (B) organic binder, (C) photopolymerizable monomer, and (D) photochemical polymerization initiator. The second embodiment contains (E) inorganic microparticles in addition to the above components. In this literature, with respect to this composition, the inorganic fine particles (E) contain, as needed, a glass powder with a softening point of 400-600° C., conductive powder, heat-resistant black pigment, silica powder, etc. However, the compositions do not contain conductive materials such as ruthenium oxide, and glass powder is not an essential component. Even when a glass component is added, lead oxide is described as the preferred main component, with no disclosure of lead-free black conductive compositions.

Japanese Patent No. 3538408 discloses photocurable conductive compositions having storage stability, providing adhesion on substrates in different steps of drying, exposure, development and firing, and resolution, and satisfying the need for both sufficient conductivity and blackness after being fired, and discloses plasma display panels (PDP) with the formation of the underlayer (black layer) electrode circuit using such compositions. The basic first embodiment of these photocurable resin compositions contains (A) black inorganic microparticles such as inorganic binder-coated ruthenium oxide or another ruthenium compound, copper-chromium black composite oxide, copper-iron black composite oxide, cobalt oxide, etc., (B) organic binder, (C) photopolymerizable monomer, and (D) photochemical polymerization initiator. The photocurable compositions described in this literature are characterized by containing inorganic binder-coated black inorganic microparticles (A). The inorganic binder-coated black inorganic microparticles (A) are obtained by pulverizing molten materials of inorganic microparticles and an inorganic binder, with an inorganic binder having a softening point of 400-600° C. and glass powder with lead oxide as the main component being described as preferred, but with no disclosure of lead-free black conductive compositions.

In particular, none of the cited prior art references teach the single layer bus (SLB) electrode concept, nor do they teach compositions which may be useful in the formation of such electrodes. The SLB concept provides manufacturers with a simplistic manufacturing method which reduces product cycle time and increases profitability, while maintaining electrical properties and blackness (L) values.

SUMMARY OF THE INVENTION

The present invention provides novel black conductive compositions to be used in flat panel display devices, for forming black electrodes having a desirable balance of all the preferred electrode properties including electrode pattern properties, blackness, resistance, and storage stability. Furthermore, the present compositions and the electrodes formed therefrom are lead-free.

Disclosed is a black conductive composition comprising, based on the total composition weight percent:
   40-70 weight percent of conductive metal particles selected from the group comprising gold, silver, platinum, palladium, copper and mixtures thereof;
   0.5-less than 3 weight percent of conductive metal oxide particles selected from $RuO_2$, ruthenium polyoxide, and mixtures thereof;
   25-59 weight percent organic matter comprising organic polymer binder and organic solvent; and
   0.5-20 weight percent of one or more lead-free bismuth glass binders wherein said glass binder comprises, based on weight percent total glass binder composition: 55-85% $Bi_2O_3$, 0-20% $SiO_2$, 0-5% $Al_2O_3$, 2-20% $B_2O_3$, 0-20% ZnO, 0-15% of one or more of oxides selected from BaO, CaO, and SrO; and 0-3% of one or more of oxides selected from $Na_2O$, $K_2O$, $Cs_2O$, $Li_2O$ and mixtures thereof; and
   wherein the softening point of said glass binder is in the range 400-600° C.; and
   wherein said composition is characterized by being lead-free or substantially lead-free.

The composition may be processed to remove the organic solvent and to form a black electrode. In particular, the composition may be used to form a single layer black electrode.

In one embodiment of the composition disclosed above, the ruthenium polyoxide is selected from $Bi_2Ru_2O_7$, $Cu_xBi_{2-x}RuO_7$, $GdBiRu_2O_7$, and mixtures thereof.

A further embodiment of the present invention is a single layer electrode of a flat panel display formed from the composition comprising, based on total composition weight percent:
   (1) 40-70 weight percent of conductive metal particles selected from the group comprising gold, silver, platinum, palladium, copper and mixtures thereof;
   (2) 0.5 to 15 weight percent of particles selected from the group comprising (a) conductive metal oxides with metallic conductivity selected from the group comprising $RuO_2$, ruthenium polyoxide, and mixtures thereof; (b) non-conductive oxide(s) selected from the group comprising Cr—Fe—Co oxide, Cr—Cu—Co oxide, Cr—Cu—Mn oxide, $Co_3O_4$, and mixtures thereof; (c) metal oxide with metallic conductivity selected from an oxide of two or more elements said elements selected from Ba, Ru, Ca, Cu, Sr, Bi, Pb, and the rare earth metals wherein said metal oxide of (c) has a surface to weight ratio in the range of 2 to 20 m$^2$/g; and (d) mixtures thereof;
   (3) 25-59 weight percent organic matter comprising organic polymer binder and organic solvent; and
   (4) 0.5-20 weight percent of one or more lead-free bismuth glass binders wherein said glass binder comprises, based on weight percent total glass binder composition: 55-85% $Bi_2O_3$, 0-20% $SiO_2$, 0-5% $Al_2O_3$, 2-20% $B_2O_3$, 0-20% ZnO, 0-15% of one or more of oxides selected from BaO, CaO, and SrO; and 0-3% of one or more of oxides selected from $Na_2O$, $K_2O$, $Cs_2O$, $Li_2O$ and mixtures thereof; and
   wherein the softening point of said glass binder is in the range 400-600° C.; and
   wherein said composition is characterized by being lead-free or substantially lead-free.

Additionally, in one embodiment of the present invention above is a single layer electrode wherein the resistivity of said electrode is in the range of 10 to 30 mΩ per square at 5 μm fired and the L value of said electrode is less than 35 with transparent overglaze paste printing and firing.

The composition of the single layer electrode above may be a photosensitive composition which further comprises a photoinitiator and a photocurable monomer.

Furthermore, one embodiment of the present invention is the single layer electrode above wherein said conductive metal particles of (1) are Ag particles present in the range of 50 to 60 weight percent total composition and wherein said particles of (2) are present in the range of 2 to 8 weight percent total composition and wherein said glass binders of (4) are present in the range of 2 to 10 weight percent total composition.

Figure 1:
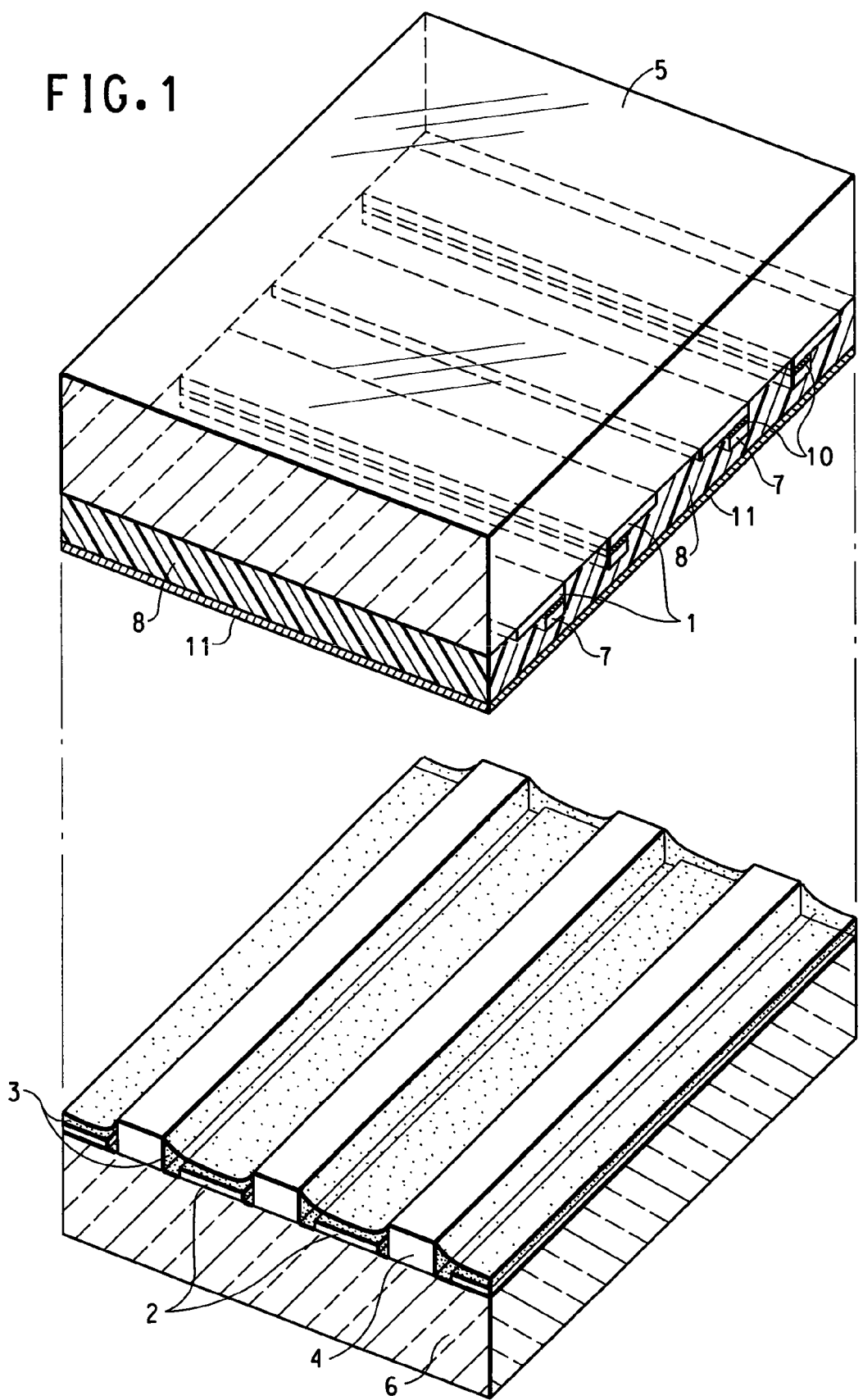
FIG. 1 is an expanded perspective diagram illustrating schematics of the AC PDP device prepared according to one embodiment of the present invention.
Figure 2A:
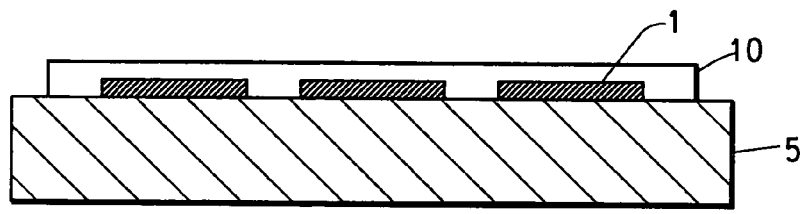
FIG. 2 is an explanatory diagram of a series of processes of the method for making the bus electrode and interconnecting electrodes positioned between said bus electrode and a transparent electrode on the same glass substrate: (a) a step for applying the photosensitive thick film composition layer for black electrode formation; (b) a step for applying a photosensitive thick film conductive composition for bus electrode formation; (c) a step for setting an exposed electrode pattern; (d) development step; (e) firing step. In the present invention, the single layer bus electrode is formed by applying one single composition (i.e., steps (a) and (b) are combined into one step in which one single layer bus electrode composition is applied). The present invention provides unique compositions which satisfy flat panel display manufacturer required electrical properties and L values, while allowing for a single step application.
Figure 2B:
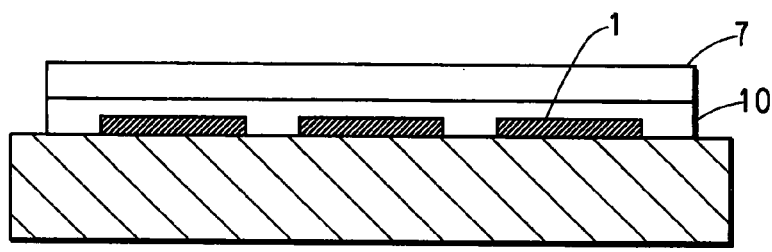
Figure 2C:
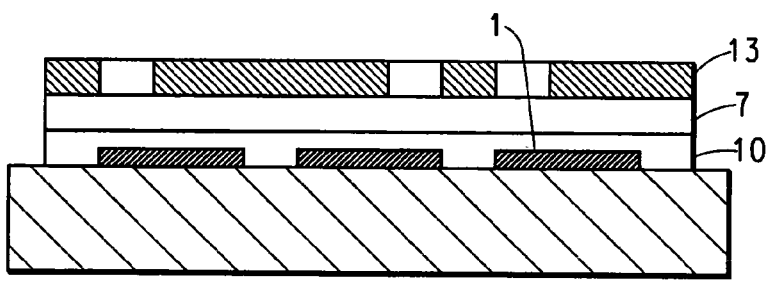
Figure 2D:
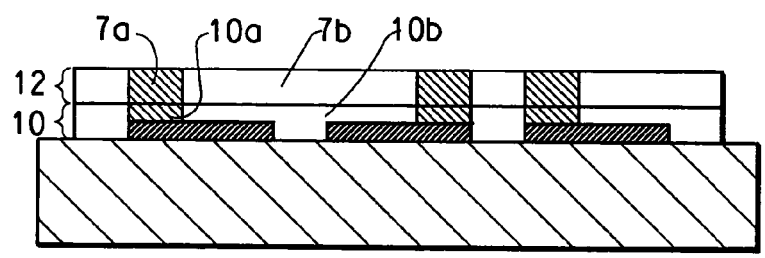
Figure 2E:
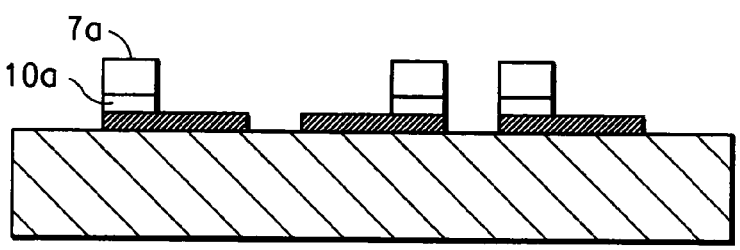
Figure 3A:
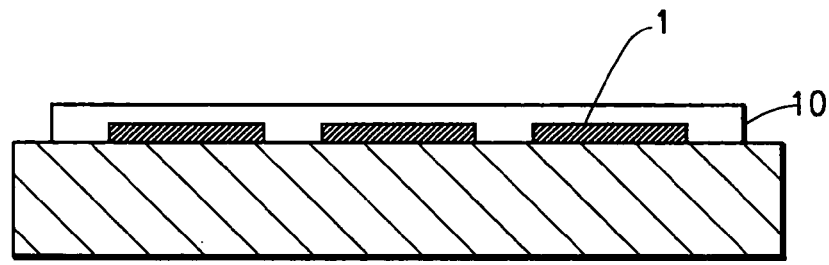
FIG. 3 is an explanatory diagram of a series of processes of the method for making the bus electrode and interconnecting electrodes positioned between said bus electrode and transparent electrode on the same glass substrate: (a) a step for applying the photosensitive thick film composition layer for black electrode formation; (b) a step for setting an exposed electrode pattern; (c) development step (d) firing step (e) a step for applying a photosensitive thick film conductive composition for bus electrode formation; (f) a step for setting an electrode pattern by imagewise exposure of the second bus electrode composition layer; (g) development step; (h) firing step. Again the present invention allows for a single layer bus electrode formation by eliminating the duplicative steps of (e) through (h) by using the compositions disclosed herein.
Figure 3B:
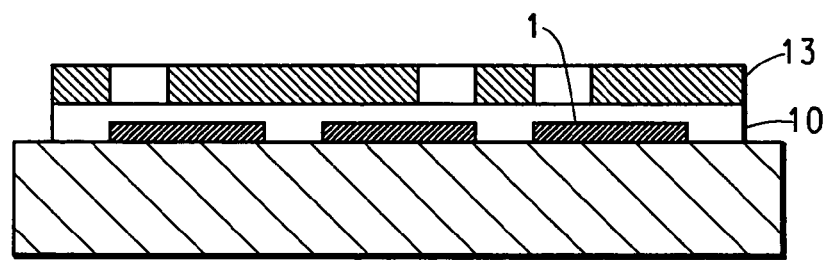
Figure 3C:
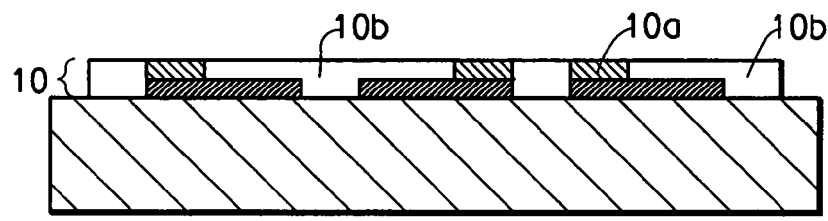
Figure 3D:
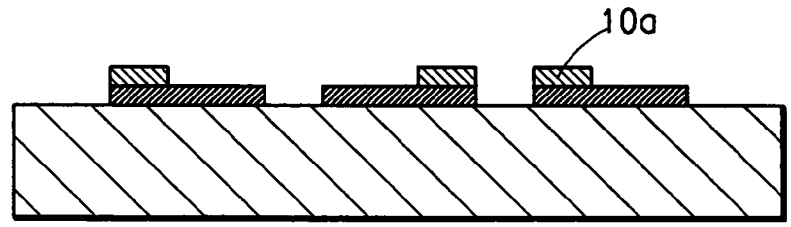
Figure 3E:
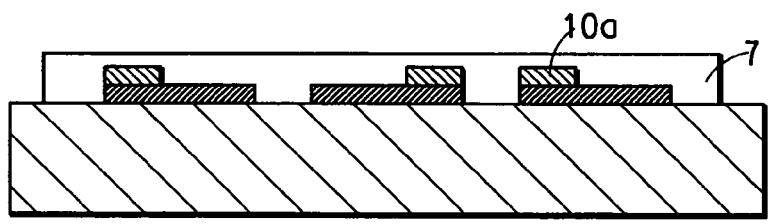
Figure 3F:
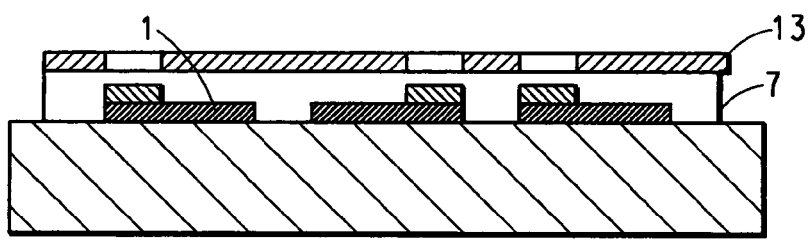
Figure 3G:
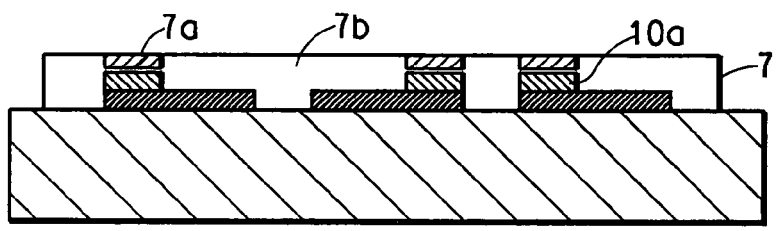
Figure 3H:
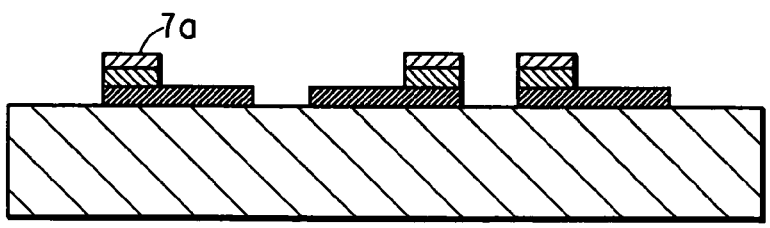

| | Explanation of symbols used in the Figures |
|---|---|
| 1 | transparent electrode |
| 2 | address electrode |
| 3 | fluorescent material |
| 4 | cell barrier |
| 5 | front glass substrate |
| 6 | rear glass substrate |
| 7 | bus conductor electrode |
| 7a | exposed part |
| 7b | unexposed part |
| 8 | dielectric layer |
| 9 | protective MgO layer |
| 10 | black electrode (photosensitive thick film electrode layer) |
| 10a | exposed part |
| 10b | unexposed part |
| 11 | MgO layer |
| 13 | phototool (target) |

DETAILED DESCRIPTION OF THE INVENTION

One embodiment of the present invention is directed to a single layer electrode of a flat panel display formed from the composition comprising, based on total composition weight percent:

(1) 40-70 weight percent of conductive metal particles selected from the group comprising gold, silver, platinum, palladium, copper and mixtures thereof;

(2) 0.5 to 15 weight percent of particles selected from the group comprising (a) conductive metal oxides with metallic conductivity selected from the group comprising $RuO_2$, ruthenium polyoxide, and mixtures thereof; (b) non-conductive oxide(s) selected from the group comprising Cr—Fe—Co oxide, Cr—Cu—Co oxide, Cr—Cu—Mn oxide, $Co_3O_4$, and mixtures thereof; (c) metal oxide with metallic conductivity selected from an oxide of two or more elements said elements selected from Ba, Ru, Ca, Cu, Sr, Bi, Pb, and the rare earth metals wherein said metal oxide of (c) has a surface to weight ratio in the range of 2 to 20 $m^2/g$; and (d) mixtures thereof;

(3) 25-59 weight percent organic matter comprising organic polymer binder and organic solvent; and (4) 0.5-20 weight percent of one or more lead-free bismuth glass binders wherein said glass binder comprises, based on weight percent total glass binder composition: 55-85% $Bi_2O_3$, 0-20% $SiO_2$, 0-5% $Al_2O_3$, 2-20% $B_2O_3$, 0-20% ZnO, 0-15% of one or more of oxides selected from BaO, CaO, and SrO; and 0-3% of one or more of oxides selected from $Na_2O$, $K_2O$, $Cs_2O$, $Li_2O$ and mixtures thereof; and wherein the softening point of said glass binder is in the range 400-600° C.; and wherein said composition is characterized by being lead-free or substantially lead-free.

In the present invention, the ruthenium polyoxide is preferably $Bi_2Ru_2O_7$, $Cu_xBi_{2-x}RuO_7$, or $GdBiRu_2O_7$.

The present invention provides black conductive compositions for use in single layer bus electrodes with an excellent balance of properties such as the adhesive property, appearance and dimensional stability after being fired, resistance and blackness and also concerns black electrodes having such properties.

(A) Conductive Metal Oxide Particles and Non-conductive Oxides (Inorganic Black Pigments)

The black conductive compositions of the present invention comprise 0.5 to 15 weight percent, based on total black conductive composition of particles selected from the group comprising (a) conductive metal oxides (oxides with metallic conductivity; $RuO_2$, ruthenium polyoxide, and mixtures thereof); (b) Non-conductive Oxide(s) selected from the group comprising Cr—Fe—Co oxide, Cr—Cu—Co oxide, Cr—Cu—Mn oxide, $Co_3O_4$, and mixtures thereof; (c) a metal oxide with metallic conductivity selected from an oxide of two or more elements selected from Ba, Ru, Ca, Cu, Sr, Bi, Pb, and the rare earth metals wherein said metal oxide has a surface to weight ratio in the range of 2 to 20 $m^2/g$; and (d) mixtures thereof. In one embodiment, the particles above in (a), (b), (c), and (d) are present in the total black conductive composition, and therefore are present in the same amount in the single layer electrode formed from such compositions in the range of 2 to 8 weight percent total black composition.

Some of the embodiments of the conductive black compositions of the present invention contain finely divided particles of inorganic material comprising an oxide of two or more elements selected from Ba, Ru, Ca, Cu, Sr, Bi, Pb, and the rare earth metals. In particular, these oxides are metal oxides with metallic conductivity. Rare earth metals include Scandium (Sc) and Yttrium (Y) (atomic numbers 21 and 39) and the lanthanide elements, which include La, Ce, Pr, Nd, Pm, Sm, Eu, Gd, Tb, Dy, Ho, Er, Tm, Yb, and Lu (atomic numbers 57 through 71). Preferred oxides are oxides of two or more elements selected from Ba, Ru, Ca, Cu, La, Sr, Y, Nd, Bi, and Pb.

The surface area to weight ratio of the metal oxide(s) of the present invention is in the range of 2 to 20 $m^2/g$. In one embodiment, the range is 5 to 15 $m^2/g$. In a further embodiment, the range of surface area to weight ratio is 6 to 10 $m^2/g$.

Non-conductive substances which may be used in the black conductive composition of the present invention include inorganic black pigments. Commercially available inorganic black pigments can be used as the preferred non-conductive oxides. Examples include non-conductive black oxides, such as Cr—Fe—Co oxide, Cr—Cu—Co oxide, Cr—Cu—Mn oxide, $Co_3O_4$, or their mixture. In the present invention, the shape of the non-conductive substance is not important. When the dispersion is used to prepare a thick film paste that is usually applied by means of screen printing, the maximum particle size should not exceed the thickness of the screen. It is preferred that at least 80 wt % of the non-conductive solid have a particle size in the range of 0.1-1.0 μm.

The ruthenium polyoxide is a type of pyrochlore, which is a multicomponent compound of $Ru^{+4}$, $Ir^{+4}$, or their mixture (M'') represented by the general formula shown below:

$(M_xBi_{2-x})(M'_yM''_{2-y})O_{7-z}$

In the formula, M is selected from a group consisting of yttrium, thallium, indium, cadmium, lead, copper, and rare earth materials; M' is selected from a group consisting of platinum, titanium, chromium, rhodium, and antimony; M'' is ruthenium, iridium, or their mixture; x is 0-2, or $x \leq 1$ with respect to monovalent copper; y is 0-0.5 but when M' is rhodium or is more than 1 of platinum, titanium, chromium, rhodium, or antimony, y is 0-1, and z is 0-1 but when M is bivalent lead or cadmium, this is at least equal to about x/2.

The above ruthenium-based pyrochlore oxide is described in detail in U.S. Pat. No. 3,583,931, which is herein incorporated by reference.

Lead containing ruthenium-based pyrochlore oxides may be used in the present invention when a lead-containing system is acceptable. Examples of such oxides include, lead ruthenate $Pb_2Ru_2O_6$, $Pb_{1.5}Bi_{0.5}Ru_2O_{6.5}$, $PbBiRu_2O_{6.75}$.

Preferred ruthenium polyoxides are bismuth ruthenate $Bi_2Ru_2O_7$, $Cu_xBi_{2-x}RuO_7$, or $GdBiRu_2O_7$. These materials are readily available in purified form and have no adverse effect on the glass binder. These materials are also stable up to 1000° C. in air and relatively stable even under a reductive atmosphere.

Since the thick film composition of the present invention utilizes a Bi-based glass frit, BiRu pyrochlore, as the conductive oxide component, is particularly useful due to the chemical compatibility of the oxide and frit and decreased expense of the oxide component. For example, although $RuO_2$ functions as a black conductive oxide component, the Ru content in $RuO_2$ is about 70%, thus it is very expensive. BiRu pyrochlore has a Ru content of about 30%, which is one half of $RuO_2$, undergoes no significant chemical reaction with Ag below 600° C., and has good wetting with glass compared with black pigments other than $RuO_2$ and Ru, therefore it is a preferred lead-free black conductive oxide component.

In one embodiment, the content of ruthenium oxide, ruthenium pyrochlore oxide, non-conductive metal oxide(s), and mixtures thereof, based on the overall conductive black composition weight, is 0.5-15 wt %. In one embodiment, the ruthenium oxide, ruthenium pyrochlore oxide, non-conductive metal oxide(s), and mixtures thereof are present in the range of 0.1 to less than 3 weight percent, based on total black composition. In a further embodiment, the ruthenium oxide, ruthenium pyrochlore oxide, non-conductive metal oxide(s), and mixtures thereof are present in the range of 2-8 weight percent, based on total black composition.

In still a further embodiment of the present invention, the content of ruthenium oxide, ruthenium pyrochlore oxide, and mixtures thereof, based on the overall conductive black composition weight, is 0.5-15 wt %. In one embodiment, the ruthenium oxide, ruthenium pyrochlore oxide, and mixtures thereof are present in the range of 0.1 to less than 3 weight percent, based on total black composition. In a further embodiment, the ruthenium oxide, ruthenium pyrochlore oxide, and mixtures thereof are present in the range of 2-8 weight percent, based on total black composition.

The surface area to weight ratio of the conductive metal oxide(s) of the present invention is in the range of 2 to 20 $m^2/g$. In one embodiment, the range is 5 to 15 $m^2/g$. In a further embodiment, the range of surface area to weight ratio is 6 to 10 $m^2/g$.

The black conductive compositions of the present invention are used for the black electrode layer in a one (or single) layer structure of a bus electrode. Typically, a bus electrode comprises a highly conductive metal layer and a black electrode as its under layer (between the bus electrode and transparent substrate). Thus, a two layer structure. However, in the present invention, the compositions are used in a single layer bus electrode structure. The black electrode layer of the present invention comprises the conductive metal oxides, as described in (A) above as a necessary component. In addition to the conductive metal oxides of (A) above, the black electrode layer may also, optionally comprise the conductive metal particles described in (B) below. When the black electrode layer comprises the conductive metal particles of (B), a single layer structure can be used (i.e., the highly conductive metal layer and black electrode layer are combined in one layer). It is understood by those skilled in the art that the compositions of the present invention may be used to form thick film tape compositions wherein the composition(s) have been processed to remove the organic solvent.

(B) Conductive Metal Particles of the Black Conductive Compositions for Single Layer Electrode Formation.

The black conductive composition of the present invention comprises one or more precious metals including gold, silver, platinum, palladium, copper and combinations thereof. Virtually any shape metal powder, including spherical particles and flakes (rods, cones, and plates) may be used in the compositions of the present invention. The preferred metal powders are selected from the group comprising gold, silver, palladium, platinum, copper and combinations thereof. It is preferred that the particles be spherical. It has been found that the dispersion of the invention should not contain a significant amount of conductive metal solids having a particle size of less than 0.2 μm. When particles of this small size are present, it is difficult to adequately obtain complete burnout of the organic medium when the films or layers thereof are fired to remove the organic medium and to effect sintering of the inorganic binder and the metal solids. When the dispersions are used to make thick film pastes, which are usually applied by screen printing, the maximum particle size should not exceed the thickness of the screen. It is preferred that at least 80 percent by weight of the conductive solids fall within the 0.5-10 μm range.

In addition, it is preferred that the surface area to weight ratio of the optional electrically conductive metal particles not exceed 20 m$^2$/g, preferably not exceed 10 m$^2$/g and more preferably not exceed 5 m$^2$/g. When metal particles having a surface area to weight ratio greater than 20 m$^2$/g are used, the sintering characteristics of the accompanying inorganic binder are adversely affected. It is difficult to obtain adequate burnout and blisters may appear.

Often although not required, copper oxide may be added to improve adhesion. The copper oxide should be present in the form of finely divided particles, preferably ranging in size from about 0.1 to 5 microns. When present as $Cu_2O$, the copper oxide comprises from about 0.1 to about 3 percent by weight of the total composition, and preferably from about 0.1 to 1.0 percent. Part or all of the $Cu_2O$ may be replaced by molar equivalents of CuO.

Additionally, in the compositions of the present invention, non-conductive materials may optionally be added to the black conductive compositions, as needed. Preferred non-conductive materials may be inorganic black pigments that are widely available commercially. In the present invention, the form of the non-conductive materials is not important. When the powder is dispersed to be processed by screen printing, the maximum particle diameter should not exceed the screen thickness.

(C) Glass Binder (Glass Frit)

The glass binder (glass frit) used in the present invention promotes the sintering of conductive component particles. The glass binder used in the present invention is a lead-free, low-melting glass binder.

The glass binder is a lead-free and cadmium-free Bi based amorphous glass. Other lead-free, low-melting glasses are P based or Zn—B based compositions. However, P based glass does not have good water resistance, and Zn—B glass is difficult to obtain in the amorphous state, hence Bi based glasses are preferred. Bi glass can be made to have a relatively low melting point without adding an alkali metal and has little problems in making a powder. In the present invention, Bi glass having the following characteristics is most preferred.

(I) Glass Composition

| |
|---|
| 55-85 wt % $Bi_2O_3$ |
| 0-20 wt % $SiO_2$ |
| 0-5 wt % $Al_2O_3$ |
| 2-20 wt % $B_2O_3$ |
| 0-20 wt % ZnO |
| 0-15 wt % one or more of oxides selected from BaO, CaO, and SrO (in the case of an oxide mixture, the maximum total is up to 15 wt %). |
| 0-3 wt % one or more of oxides selected from $Na_2O$, $K_2O$, $Cs_2O$ and $Li_2O$ (in the case of an oxide mixture, the maximum total is up to 3 wt %). |

(II) Softening Point: 400-600° C.

In this specification, "softening point" means the softening point determined by differential thermal analysis (DTA).

In the present invention, the glass binder composition and softening point are important characteristics for ensuring a good balance of all the properties of a black electrode are obtained.

When the softening point is below 400° C., melting of the glass may occur while organic materials are decomposed, allowing blisters to occur in the composition. Therefore it is preferred that the softening point of the glass is >400° C. On the other hand, the glass must soften sufficiently at the firing temperature employed. For example, if a firing temperature of 550° C. is used, then the softening point should be <520° C., if the softening point exceeds 520° C. electrode peeling occurs at the corners and properties such as resistance, etc., are affected, compromising the balance of the electrode properties. If a higher firing temperature is used (depending on substrate) glass with softening point up to 600° C. can be used.

The glass binders used in the present invention preferably have a $D_{50}$ (i.e., the point at which ½ of the particles are smaller than and ½ are larger than the specified size) of 0.1-10 μm as measured by a Microtrac. More preferably, the glass binders have a $D_{50}$ of 0.5 to 1 μm. Usually, in an industrially desirable process, a glass binder is prepared by the mixing and melting of raw materials such as oxides, hydroxides, carbonates, etc., making into a cullet by quenching, mechanical pulverization (wet, dry), then drying in the case of wet pulverization. Thereafter, if needed, classification is carried out to the desired size. It is desirable for the glass binder used in the present invention to have an average particle diameter smaller than the thickness of the black conductive layer to be formed.

A combination of glasses with different softening point may be used in the present invention. High softening point glasses can be combined with low softening point glasses. The proportion of each different softening point glass is determined by the precise balance of the electrode properties required. Some portion of the glass binder may be comprised a glass(s) with a softening point above 600° C.

Based on the overall composition weight, the glass binder content should be 0.5 to 20 wt %. When the glass binder content is too small, bonding to the substrate is weak. In one embodiment, the glass binder is present in the range of 2 to 10 weight percent total black composition.

The compositions of the present invention may also comprise organic matter. Organic matter is present in the composition in the range of 25-59 wt %, based on total composition. The organic matter included in the present invention may comprise an organic polymer binder and organic solvent. The organic matter may further comprise photoinitiators, photocurable monomers, etc. These are explained below.

(D) Organic Polymer Binders

The polymeric binders are important in the compositions of the present invention and should be selected considering the water-based developability and high resolution. Such requirements are satisfied by the following binders. Such binders may be copolymers and interpolymers (mixed polymers) made from (1) non-acidic comonomers such as $C_{1-10}$ alkyl acrylates, $C_{1-10}$ alkyl methacrylates, styrene, substituted styrene, or combinations thereof, and (2) acidic comonomers including an ethylenically unsaturated carboxylic acid in at least 15 wt % of the total polymer weight.

The presence of the acidic comonomers in the compositions is important in the technology of the present invention. With such an acidic functional group, development in an aqueous base such as a 0.4 wt % sodium carbonate aqueous solution is possible. If the acidic comonomer content is less than 15 wt %, the composition may not be washed off completely by the aqueous base. If the acidic comonomer content is above 30%, the composition has low stability under the development conditions and the image area is only partially developed. Suitable acidic comonomers may be ethylenically unsaturated monocarboxylic acids such as acrylic acid, methacrylic acid, crotonic acid, etc.; ethylenically unsaturated dicarboxylic acids such as fumaric acid, itaconic acid, citraconic acid, vinylsuccinic acid, maleic acid, etc., their half esters (hemiesters), as well as sometimes their anhydrides and mixtures. For clean burning under a low-oxygen atmosphere, methacrylic polymers are preferred over acrylic polymers.

When the non-acidic comonomers are alkyl acrylates or alkyl methacrylates described above, the non-acidic comonomer content in the polymeric binders should be at least 50 wt %, preferably 70-75 wt %. When the non-acidic comonomers are styrene or substituted styrene, the non-acidic comonomer content in the polymeric binder should be 50 wt %, with the remaining 50 wt % being an acid anhydride such as maleic anhydride hemiester. The preferred substituted styrene is α-methylstyrene.

While not preferred, the non-acidic portion of the polymeric binder may contain less than about 50 wt % of other non-acidic comonomers substituting the alkyl acrylate, alkyl methacrylate, styrene, or substituted styrene portion of the polymer. For example, they include acrylonitrile, vinyl acetate, and acrylamide. However, in such cases, complete combustion is more difficult, thus such a monomer content should be less than about 25 wt % of the overall polymeric binder weight. Binders may consist of a single copolymer or combinations of copolymers fulfilling various standards described above. In addition to the copolymers described above, other examples include polyolefins such as polyethylene, polypropylene, polybutylene, polyisobutylene, ethylene-propylene copolymer, etc., as well as polyethers such as lower alkylene oxide polymers including polyethylene oxide.

These polymers can be prepared by solution polymerization technology commonly used in the acrylic acid ester polymerization field.

Typically, the acidic acrylic acid ester polymers described above can be obtained by mixing an α- or β-ethylenically unsaturated acid (acidic comonomer) with one or more copolymerizable vinyl monomers (non-acidic comonomer) in an organic solvent having a relatively low boiling point (75-150° C.) to obtain a 10-60% monomer mixture solution, then adding a polymerization catalyst to the monomer, followed by polymerization. The resulting mixture is heated under ambient pressure at the reflux temperature of the solvent. After completion of the polymerization reaction, the resulting acidic polymer solution is cooled to room temperature. A sample is recovered and measured for the polymer viscosity, molecular weight, and acid equivalent.

The acid-containing polymeric binder described above should have a molecular weight below 50,000.

When such compositions are coated by screen printing, the polymeric binder should have a Tg (glass transition temperature) exceeding 60° C.

In general, the organic matter may be present in the compositions of the present invention in the range of 25-59 weight percent total black conductive composition(s).

(E) Photoinitiators

Suitable photoinitiators are thermally inert but generate free radicals when exposed to actinic radiation at a temperature below 185° C. These photoinitiators are compounds having two intramolecular rings inside a conjugated carbon ring system and include (un)substituted polynuclear quinines, e.g., 9,10-anthraquinone, 2-methylanthraquinone, 2-ethylanthraquinone, 2-t-butylanthraquinone, octamethylanthraquinone, 1,4-naphthoquinone, 9,10-phenanthrenequinone, benz[a]anthracene-7,12-dione, 2,3-naphthacene-5,12-dione, 2-methyl-1,4-naphthoquinone, 1,4-dimethylanthraquinone, 2,3-dimethylanthraquinone, 2-phenylanthraquinone, 2,3-diphenylanthraquinone, retenquinone [transliteration], 7,8,9,10-tetrahydronaphthacene-5,12-dione, and 1,2,3,4-tetrahydrobenz[a]anthracene-7,12-dione. Other useful photoinitiators are described in U.S. Pat. No. 2,760,863 [Of these, some are thermally active at a low temperature of 85° C., such as vicinal ketaldonyl alcohols, e.g., benzoin and pivaloin; acyloin ethers such as benzoin methyl or ethyl ether; α-methylbenzoin, α-allylbenzoin, α-phenylbenzoin, thioxanthone and its derivatives, hydrogen donors, hydrocarbon-substituted aromatic acyloin, etc.]

For initiators, photo-reducible dyes and reducing agents may be used. These are described in U.S. Pat. Nos. 2,850,445, 2,875,047, 3,097,96, 3,074,974, 3,097,097, and 3,145,104 and include phenazine, oxazine, quinones, e.g., Michler's ketone, ethyl Michler's ketone, and benzophenone, as well as hydrogen donors including leuco dyes-2,4,5-triphenylimidazolyl dimmer and their mixtures (U.S. Pat. Nos. 3,427,161, 3,479,185, and 3,549,367). The sensitizers described in U.S. Pat. No. 4,162,162 are useful with the photoinitiators and photoinhibitors. The photoinitiators and photoinitiator systems are present at 0.05-10 wt % based on the overall weight of the dry photopolymerizable layer.

(F) Photocurable Monomer

The photocurable monomer component used in the present invention has at least one polymerizable ethylene group and contains at least one addition-polymerizable ethylenically unsaturated compound.

These compounds initiate polymer formation by free radicals and undergo chain-extending addition polymerization. The monomeric compounds are not gaseous, i.e., having boiling point higher than 100° C., and have plasticizing effects on the organic polymeric binders.

Preferred monomers that can be used alone or in combination with other monomers include t-butyl (meth)acrylate, 1,5-pentanediol di(meth)acrylate, N,N-dimethylaminoethyl (meth)acrylate, ethylene glycol di(meth)acrylate, 1,4-butanediol di(meth)acrylate, diethylene glycol di(meth)acrylate, hexamethylene glycol di(meth)acrylate, 1,3-propanediol di(meth)acrylate, decamethylene glycol di(meth)acrylate, 1,4-cyclohexanediol di(meth)acrylate, 2,2-dimethylolpropane di(meth)acrylate, glycerol di(meth)acrylate, tripropylene glycol di(meth)acrylate, glycerol tri(meth)acrylate, trimethylol propane tri(meth)acrylate, compounds described in U.S. Pat. No. 3,380,381, 2,2-di(p-hydroxyphenyl)propane di(meth)acrylate, pentaerythritol tetra (meth)acrylate, triethylene glycol diacrylate, polyoxyethylene-1,2-di(p-hydroxyethyl)propane dimethacrylate, bisphenol A di[3-(meth)acryloyloxy-2-hydroxypropyl] ether, bisphenol A di[2-(meth)acryloyloxyethyl] ether, 1,4-butanediol di(3-methacryloyloxy-2-hydroxypropyl)ether, triethylene glycol dimethacrylate, polyoxyporpyltrimethylolpropane triacrylate, butylenes glycol di(meth)acrylate, 1,2,4-butanediol [sic] tri(meth)acrylate, 2,2,4-trimethyl-1,3-pentanediol di(meth)acrylate, 1-phenylethylene 1,2-dimethacrylate, diallyl fumarate, styrene, 1,4-benzenediol dimethacrylate, 1,4-diisopropenylbenzene, and 1,3,5-triisopropenylbenzene [(meth)acrylate means both acrylate and methacrylate].

Useful are ethylenically unsaturated compounds having molecular weights below 300, e.g., an alkylene or polyalkylene glycol diacrylate prepared from an alkylene glycol or polyalkylene glycol, such as a 1-10 ether bond-containing $C_{2-15}$ alkylene glycol, and those described in U.S. Pat. No. 2,927,022, such as those containing a terminal addition-polymerizable ethylene bond.

Other useful monomers are disclosed in U.S. Pat. No. 5,032,490.

Preferred monomers are polyoxyethylenated trimethylolpropane tri(meth)acrylate, ethylated pentaerythritol acrylate, trimethylolpropane tri(meth)acrylate, dipentaerythritol monohydroxypentacrylate, and 1,10-decanediol dimethacrylate.

Other preferred monomers are monohydroxypolycaprolactone monoacrylate, polyethylene glycol diacrylate (molecular weight: about 200), and polyethylene glycol dimethacrylate (molecular weight: about 400). The unsaturated monomer component content is 1-20 wt % based on the overall weight of the dry photopolymerizable layer.

(G) Organic Medium

The organic medium is mainly used for the easy coating of dispersions containing a finely pulverized composition on ceramics and other substrates. Thus, first, the organic medium should be capable of dispersing the solid components in a stable manner and, second, the rheological property of the organic medium is to impart good coatability to the dispersion.

In the organic medium, the solvent component that may be a solvent mixture should be selected from those capable of complete dissolution of polymers and other organic components. The solvents are selected from those that are inert (not reactive) with respect to the paste composition components. Solvents are selected from those that have a sufficiently high volatility, thus evaporate well from the dispersion even when coated under ambient pressure at a relatively low temperature, while in the case of the printing process, the volatility should not be too high, causing rapid drying of the paste on the screen at room temperature. Solvents that can be favorably used in the paste compositions should have boiling point below 300° C. under ambient pressure, preferably below 250° C. Such solvents may be aliphatic alcohols or their esters such as acetic acid esters or propionic acid esters; terpenes such pine resin, α- or β-terpineol, or mixtures thereof; ethylene glycol, ethylene glycol monobutyl ether, and ethylene glycol esters such as butyl Cellosolve acetate; butyl Carbitol and Carbitol esters such as butyl Carbitol acetate and Carbitol acetate; Texanol (2,2,4-trimethyl-1,3-pentanediol monoisobutyrate), and other suitable solvents.

The compositions of the present invention may also contain additional components described below, in addition to the components described above.

(H) Additional Components

These are dispersants, stabilizers, plasticizers, releases, stripping agents, defoamers, wetting agents, etc., that are well known in the art. Common materials are disclosed in U.S. Pat. No. 5,32,490 herein incorporated by reference.

Uses

The compositions of the present invention may be compounded with photosensitive materials described above to obtain photosensitive compositions. Such photosensitive compositions may be used in various applications, including flat panel display applications.

The black conductive photosensitive compositions may also be formed into films, etc., by the usual pattern-forming technology such as screen printing, chemical etching, or coating process such spinning, dipping, etc.

The black conductive compositions of the present invention may also be utilized in processes for patterning thick film electrically functional patterns using a photosensitive polymer layer. For example, as described in Patent Publication WO 02/03766 A2 to Keusseyan herein incorporated by reference. Keusseyan describes a process for forming a pattern having electrically functional properties on a substrate comprising the steps of: (a) providing a photosensitive layer having a tacky surface disposed on a substrate; (b) providing a transfer sheet comprising a removable support and at least one layer of a thick film composition disposed on the support; (c) image-wise exposing the photosensitive tacky surface to form an imaged layer having unexposed tacky and exposed non-tacky areas; (d) applying the thick film composition of the transfer sheet onto the imaged layer; (e) separating the transfer sheet from the substrate wherein the thick film substantially remains on the support in the exposed non-tacky areas to form a patterned thick film composition; and (f) subjecting the patterned thick film composition to heat thereby forming a patterned article.

When the black conductive compositions of the present invention are used as conductive materials, these compositions may be formed on various substrates, including a dielectric layer or glass substrate (e.g., bare glass panel).

The composition of the present invention may be patterned on a transparent substrate, topped with a photosensitive material, and exposed to UV, etc., from the transparent substrate (back side) to form a photomask.

Flat Panel Display Applications

The present invention includes black electrodes formed from the above black conductive compositions. The black electrodes of the present invention can be favorably used in flat panel display applications, particularly in alternating-current plasma display panel devices. The black electrodes can be formed between the device substrate and conductor electrode array.

In one embodiment, the electrode of the present invention is used in AC PDP applications, as described below. It is understood that the compositions and electrodes of the present invention may be used in other flat panel display applications and their description in AC PDP devices is not intended to be limiting. An example of the black electrodes of the present invention used in an alternating-current plasma display panel is explained below. This description includes two-layer electrodes comprising a black electrode between the substrate and conductor electrode (bus electrode). Also, the method for making an alternating-current plasma display panel device is outlined.

The alternating-current plasma display panel device consists of front and back dielectric substrates with a gap and an electrode array containing parallel first and second electrode composite groups in a discharge space filled with ionizing gas. The first and second electrode composite groups face each other perpendicularly with the discharge space in the middle. A certain electrode pattern is formed on the surface of the dielectric substrate, and a dielectric material is coated on the electrode array on at least one side of the dielectric substrate. In this device, at least the electrode composite on the front dielectric substrate is fitted with the conductor electrode array group connected to the bus conductor on the same substrate, and with the black electrode of the present invention formed between the above substrate and the above conductor electrode array.

FIG. 1 illustrates the black electrode of the present invention in an AC PDP. FIG. 1 shows the AC PDP using the black electrode of the present invention. As shown in FIG. 1, the AC PDP device has the following components: underlying transparent electrode (1) formed on glass substrate (5); black electrode (10) formed on the transparent electrode (1) (the black conductive composition of the present invention is used for the black electrode (10)); bus electrode (7) formed on the black electrode (10) (bus electrode (7) is a photosensitive conductor composition containing conductive metal particles from metals selected from Au, Ag, Pd, Pt and Cu or combinations thereof (this is explained in more detail below)). The black electrode (10) and bus conductor electrode (7) are exposed imagewise by actinic radiation to form a pattern, developed in a basic aqueous solution, and fired at an elevated temperature to remove the organic components and to sinter the inorganic material. The black electrode (10) and bus conductor electrode (7) are patterned using an identical or very similar image. The final result is a fired, highly conductive electrode composite, which appears to be black on the surface of the transparent electrode (1), and when placed on the front glass substrate, reflection of external light is suppressed.

The word 'black' used in this specification means a black color with significant visual contrast against a white background. Therefore, the term is not necessarily limited to black which possesses the absence of color.

The degree of "blackness" may be measured with a colorimeter to determine an L-value. The L-value represents lightness where 100 is pure white and 0 is pure black. Although shown in FIG. 1, the transparent electrode described below is not necessary in forming the plasma display device of the present invention.

When a transparent electrode is used, $SnO_2$ or ITO is used for forming the transparent electrode (1), by chemical vapor deposition or electro-deposition such as ion sputtering or ion plating. The components of the transparent electrode and method for its formation in the present invention are those of the conventional AC PDP production technology, well known to those in the art.

As shown in FIG. 1, the AC PDP device of the present invention is based on a glass substrate having dielectric coating layer (8) and MgO coating layer (11) over the patterned and fired metallization.

The conductor lines are uniform in line width and are not pitted or broken, have high conductivity, optical clarity and good transparency between lines.

Next, a method for making both a bus electrode and black electrode over the optional transparent electrode on the glass substrate of the front plate of a PDP device is illustrated.

As shown in FIG. 2, the formation method of the one embodiment of the present invention involves a series of processes ((A)-(E)).

(A) A process of applying a black electrode-forming photosensitive thick film composition layer (10) on a transparent electrode (1) formed using $SnO_2$ or ITO according to a conventional method known to those in the art, on the glass substrate (5), then drying the thick film composition layer (10) in a nitrogen or air atmosphere. The black electrode composition is a lead-free black conductive composition of the present invention. (FIG. 2(A)).

(B) Applying to the first applied black electrode composition layer (10) a photosensitive thick film conductor composition (7) for forming the bus electrodes, then drying the thick film composition layer (7) in a nitrogen or air atmosphere. The photosensitive thick film conductive composition is described below. (FIG. 2(B)).

(C) Imagewise exposing the first applied black electrode composition layer (10) and the second bus electrode composition layer (7) to actinic radiation (typically a UV source) through a phototool or target (13) having a shape corresponding to a pattern of the black and bus electrodes arranged in correlation with the transparent electrodes (1), using exposure conditions that yield the correct electrode pattern after development. (FIG. 2(C))

(D) A process of developing the exposed parts (10a, 7a) of the first black conductive composition layer (10) and the second bus electrode composition layer (7) in a basic aqueous solution, such as a 0.4 wt % sodium carbonate aqueous solution or other alkali aqueous solution. This process removes the unexposed parts (10b, 7b) of the layers (10, 7). The exposed parts (10a, 7a) remain (FIG. 2 (D)). The developed product is then dried.

(E) After process, (D), the parts are then fired at a temperature of 450-650° C., depending upon the substrate material, to sinter the inorganic binder and conductive components (FIG. 2 (E)).

The formation method of the second embodiment of the present invention is explained below with FIG. 3. For convenience, the numbers assigned for each part of FIG. 3 are same as FIG. 2. The method of the second embodiment involves a series of processes (A'-H').

A'. A process of applying a black electrode-forming photosensitive thick film composition layer (10) on a transparent electrode (1) formed using $SnO_2$ or ITO according to a conventional method known to those in the art, on the glass substrate (5), then drying the thick film composition layer (10) in a nitrogen or air atmosphere. The black electrode composition is a lead-free black conductive composition of the present invention. (FIG. 3(A)).

B'. Imagewise exposing the first applied black electrode composition layer (10) to actinic radiation (typically a UV source) through a phototool or target (13) having a shape corresponding to a pattern of the black electrodes arranged in correlation with the transparent electrodes (1), using exposure conditions that yield the correct black electrode pattern after development. (FIG. 3(B)).

C'. A process of developing the exposed part (10a) of the first black conductive composition layer (10) in a basic aqueous solution such as a 0.4 wt % sodium carbonate aqueous solution or other alkali aqueous solution for removal of the unexposed parts (10b) of the layers (10) (FIG. 3 (C)). The developed product is then dried.

D'. After process, (C'), the parts are then fired at a temperature of 450-650° C., depending upon the substrate material, to sinter the inorganic binder and conductive components (FIG. 3(D)).

E'. A process of applying the bus electrode-forming photosensitive thick film composition layer (7) to the black electrode (10a) according to the fired and patterned part (10a) of the first photosensitive thick film composition layer (10), then drying in a nitrogen or air atmosphere. (FIG. 3(E)). The photosensitive thick film conductor composition is described below.

F'. Imagewise exposing the second applied bus electrode composition layer (7) to actinic radiation (typically a UV source) through a phototool or target (13) having a shape corresponding to a pattern of the bus electrodes arranged in correlation with the transparent electrodes (1) and black electrode (10a), using exposure conditions that yield the correct electrode pattern after development. (FIG. 3(F)).

G'. A process of developing the exposed part (7a) of the second bus conductive composition layer (7) in a basic aqueous solution such as a 0.4 wt % sodium carbonate aqueous solution or other alkali aqueous solution for removal of the unexposed parts (7b) of the layers (7) (FIG. 3 (G)). The developed product is then dried.

H'. After process, (G'), the parts are then fired at a temperature of 450-650° C., depending upon the substrate material, to sinter the inorganic binder and conductive components (FIG. 3 (H)).

The third embodiment (not shown) involves a series of processes ((i)-(v)) shown below. This embodiment is particularly useful in the formation of single layer electrodes.

(i) The process of loading a black electrode composition on a substrate. This black electrode composition is the black conductive composition of the present invention described above.

(ii) The process of loading a photosensitive conductive composition on a substrate. This photosensitive conductive composition is described below.

(iii) The process of setting an electrode pattern by imagewise exposure of the black composition and conductive composition by actinic radiation.

(iv) The process of developing the exposed black composition and conductive composition by a basic aqueous solution for removal of the area not exposed to actinic radiation.

(v) The process of firing the developed conductive composition.

The front glass substrate assembly formed as described above can be used for a AC PDP. For example, referring back to FIG. 1, after forming the transparent electrode (1) in relation to the black electrode (10) and bus electrode (7) on the front glass substrate (5), the front glass substrate assembly is covered with dielectric layer (8), then coated with MgO layer (11). Next, the front glass substrate (5) is combined with rear glass substrate (6). A number of display cells screen printed with phosphor with cell barrier (4) formation are set on the rear glass (6). The electrode formed on the front substrate assembly is perpendicular to the address electrode formed on the rear glass substrate. The discharge space formed between the front glass substrate (5) and rear glass substrate (6) is sealed with a glass seal and at the same time a mixed discharge gas is sealed into the space. The AC PDP device is thus assembled.

Next, bus conductive compositions for bus electrodes are explained below.

The bus conductive compositions used in the present invention may be photosensitive thick film conductive compositions available commercially. As noted above, the bus conductive composition comprises (a) conductive metal particles of at least one metal selected from Au, Ag, Pd, Pt, and Cu and combinations thereof; (b) at least one inorganic binder; (c) photoinitiator; and (d) photocurable monomer. In one embodiment of the present invention, the bus conductive composition comprises Ag.

The conductive phase is the main component of the above composition, typically comprising silver particles with a particle diameter within the range of 0.05-20 μm (microns) in a random or thin flake shape. The bus conductive composition is herein described with reference to one embodiment comprising silver particles, but is not intended to be limiting. When a UV-polymerizable medium is used together with the composition, the silver particles should have a particle diameter within the range of 0.3-10 μl. Preferred compositions should contain 50-60 wt % of silver particles based on the overall thick film paste.

The silver conductive composition for forming a bus electrode may also contain 0-10 wt % of a glass binder and/or 0-10 wt % of refractory materials that do not form glass or a precursor as needed, in addition to Ag. Examples of the glass binder include lead-free glass binders described in the Claims of the present invention. Refractory materials that do not form glass and precursors are, e.g., alumina, copper oxide, gadolinium oxide, tantalum oxide, niobium oxide, titanium oxide, zirconium oxide, cobalt iron chromium oxide, aluminum, copper, various commercially available inorganic pigments, etc.

Objectives for adding the second, third, and more inorganic additives in addition to such main components are for control of the pattern shape, suppression or promotion of sintering during firing, adhesive property retention, control of the main-metal component diffusion, inhibition of discoloration near the bus electrode, control of resistance, control of the thermal expansion coefficient, mechanical strength retention, etc. The type and amount are selected as needed within the range of having no significant adverse effects on the basic performance.

Furthermore, the silver conductive compositions may also contain 10-30 wt % of a photosensitive medium in which the above particulate materials are dispersed. Such a photosensitive medium may be polymethyl methacrylate and a polyfunctional monomer solution. This monomer is selected from those with a low volatility for minimizing evaporation during the silver conductive composition paste preparation and printing/drying process before the UV curing. The photosensitive medium also contains a solvent and UV initiator. The preferred UV polymerizable medium includes a polymer based on methyl methacrylate/ethyl acrylate in a 95/5 ratio (weight based). The silver conductive composition described above has a viscosity of 10-200 Pa-s, for a free-flowing paste.

Suitable solvents for such a medium are, but not limited to, butyl Carbitol acetate, Texanol® and β-terpineol. Additional solvents that may be useful include those listed in Section (G) Organic Medium, above. Such a medium may be treated with dispersants, stabilizers, etc.

Preparation of Photosensitive Wet-developable Pastes (A) Preparation of Organic Materials The solvent and acrylic polymer were mixed, stirred, and heated to 100° C. to complete dissolution of the binder polymer. The resulting solution was cooled to 80° C., treated with the remaining organic components, stirred to complete the dissolution of all solids, passed through a 325-mesh filter screen, and cooled.

(B) Preparation of Paste

The paste was prepared by mixing an organic carrier, one or more monomers, and other organic components in a mixing vessel under yellow light. The inorganic materials were then added to the mixture of organic components. The entire composition was then mixed until the inorganic particles were wetted with the organic material. This mixture was roll-milled using a 3-roll mill. The resulting paste was used as obtained or was passed through a 635-mesh filter screen. At this point, the paste viscosity was adjusted by carriers or solvents to a viscosity most suitable for optimum processing.

Care was taken to avoid dirt contamination in the process of preparing paste compositions and in preparing parts, since such contamination can lead to defects.

(C) Preparation Conditions (1) Formation of Black Electrode

Depending on the composition and desired thickness after drying, the paste was applied to the glass substrate by screen printing, using a 200-400 mesh screen. The example black pastes were applied to the glass substrates by screen printing, using a 350 mesh polyester screen. Parts to be tested as a 2-layer structure were prepared on a glass substrate on which a transparent electrode (thin film ITO) has been formed. Parts to be tested as a single layer (black only) structure were prepared on a glass substrate without the ITO film. Parts were then dried at 80° C. for 20 min in a hot-air circulation oven to form a black electrode with a dry film thickness of 2-6 μm.

Parts to be tested as a single layer (black only) structure were then fired (see process 5).

Parts to be tested as a 2-layer structure were then processed as shown below (see process 2-5).

(2) Formation of Bus Conductive Electrode

Next, a photoimage-forming Ag conductive paste was overlaid by screen printing using a 325stainless steel mesh screen. This photoimage-forming Ag conductive paste was a photosensitive Ag paste containing 2 wt % of bismuth glass frit B in the paste and 64-72 wt % of Ag powder (average particle diameter: 1.3-2.0 μm). In the examples below, 4 Ag conductive pastes with compositions described later (Ag paste A, Ag paste B, Ag paste C, Ag paste D) were used. These 4 Ag conductive pastes gave essentially the same properties as bus conductor electrodes.

This part was dried again at a temperature of 80° C. for 20 min. The dry film thickness was 6-10 μm. The dry thickness for the two-layer structure was 10-16 μm.

(3) UV Pattern Exposure

The two-layer parts were exposed through a phototool using a collimated UV light source Illumination: 5-20 mW/cm$^2$. Exposure energy: 400 mj/cm$^2$; off contact exposure, mask-coating gap: 150 μm).

(4) Development

The exposed part was placed on a conveyor, then led into a spray developer containing a 0.4 wt % sodium carbonate aqueous solution as the developer solution. The developer solution temperature was maintained at 30° C., and sprayed at 10-20 psi. The part was subjected to a development time of 20 seconds (corresponding to 3-4 times time to clean—TTC). The developed part was dried by blowing off the excess water in a forced air stream.

(5) Firing

The dried parts were then fired in a belt furnace in an air atmosphere using a 2.5 hr. profile, reaching a peak temperature of 550° C.

EXAMPLES

In the examples illustrated below, the constitutional components are shown in wt %.

Test Procedures

Dried Black Thickness

The dry film thickness of the black electrode was measured at four different points using a contact profilometer, such as a Tencor Alpha Step 2000.

Dried Ag/Black Thickness

The Ag electrode was coated on the dried film of the black electrode, then dried. The dry film thickness of the Ag/Black composite layer was measured using the same method as black electrode above.

Line Resolution

Imaged samples were inspected using a zoom microscope at a minimum magnification of 20× with 10× oculars. The finest group of lines, which are completely intact without any shorts (connections between the lines) or opens (complete breaks in a line), is the stated line resolution for that sample.

4 mil Line Thickness

The fired film thickness was measured on the 4 mil width lines that were used to measure resistivity. Measurement was made using a contact profilometer.

4 mil Line Edge Curl

When the 4 mil line film thickness was measured, the devil's horn-shaped protrusion of the edges is observed in some cases, and the length of this devil's horn is called edge curl. With a large edge curl, the effective film thickness is decreased by the edge curl after the transparent dielectric material is formed by printing, lamination, or coating, then fired; this causes bubble inclusion, leading to the possibility of dielectric breakdown, thus edge curl is not desired. No edge curl, i.e., edge curl being 0 μm, is most desirable. It is known that even with most well-used lead-containing conductive compositions, the edge curl is about 1-3 μm.

Peeling

The degree of pattern corner lifting after being fired is observed under a microscope and classified into levels of none, slight (or low), medium, med-high (or medium-high), and high. With lead-containing conductive compositions (Pb type material) that are the most well used currently, a slight level of corner lifting is observed, while no corner lifting is most desirable.

L Value Ag/Black Two Layer

After firing, the blackness viewed from the back of the glass substrate is measured mechanically. For blackness, the color (L*) was measured using the optical sensor SZ and color measurement system Σ 80 of Nippon Denshoku Kogyo with calibration using a standard white plate, with 0 being pure black and 100 pure white. Alternatively, color measurements were done using a Minolta CR-300 calorimeter, calibrated with multiple standards (white, red, and black). Color was measured on the CIE L*a*b. L* represents lightness where 100 is pure white and 0 is pure black.

L Value of Single Layer (Black Only)

An ITO film-free insulation glass substrate was coated with a black electrode as in (1) above and dried. Omitting each of the processes (2), (3), and (4), the dry black electrode thus obtained is fired under the same conditions of the process of (5) to form a single solid fired black electrode layer. After the firing, the blackness viewed from the back of the glass substrate was measured by the color meter of Nippon Denshoku or the Minolta CR-300 colorimeter under the conditions used for the above L value Ag/black two layer, with 0 being pure black and 100 pure white.

Black Resistance (ohm)

In this evaluation the resistance of the black electrode was measured. This method is used to confirm the conductive property of the fired black layer. Using the test part described above (L value of single layer), the resistance of the black electrode fired film was measured using a resistance meter with a probe distance of about 4 cm. Using this equipment, the maximum resistance that can be measured is 1 Gohm.

Black/Ag Two Layers Resistivity (m ohm/sq@5 μm)

This is the sheet resistance value (mΩ/sq) per unit of fired film thickness (5 μm). This is measured on the 4 mil lines. This value equates to 2 times the so-called specific resistance (μΩ-cm). When the prior art lead-containing conductive composition (Pb type Commercial Product Number DC243 paste available from E.I. du Pont de Nemours and Company) and Ag electrode (DC206) are used, this value is known to be about 11-13 mohm/sq@5 μm. The lower this value, the better.

Glossary

Ts: Softening Point Determined in Differential Thermal Analysis (DTA)

Compositions of each component used in the examples of this specification are given below.

Organic Components

Organic binder A

Monomer A: monomer TMPEOTA (trimethylolpropane ethoxytriacrylate)

Solvent A: solvent, Texanol

Organic additive A: additive, malonic acid

Organic additive B: additive BHT

Organic binder B

Monomer B: oligomer, CN2271, polyester acrylate oligomer, available from Sartomer Co., Inc. in Pennsylvania Solvent A: solvent, Texanol Organic additive C: additive, CBT (1H-benzotriazolecarboxylic acid)

| Organic binder A | | |
|---|---|---|
| Acrylic Resin A | 34.78 | Acrylic resin (Carboset XPD1234), methyl methacrylate 75%, methacrylic acid 25%, Mx = ~7000, Tg = 120° C., acid value = 164 |
| Solvent A | 46.64 | Texanol |
| Resin B | 1.46 | PVP/VA, vinylpyrrolidone-vinyl acetate copolymer |
| Initiator A | 8.78 | Photoinitiator, DETX (diethylthioxanthone) |
| Initiator B | 8.28 | Photoinitiator, EDAB (ethyl 4-dimethylaminobenzoate) |
| Inhibitor A | 0.06 | Light stabilizer TAOBN (1,4,4-trimethyl-2,3-diazabicyclo[3.2.2]non-2-ene-N,N'-dioxide |

| Organic binder B | | |
|---|---|---|
| Acrylic Resin B | 29.02 | Acrylic resin MMA/ETHYL ACRYLATE/BMA/MAA copolymer. Mw = ~30000, acid value = ~130 |
| Solvent A | 33.85 | Texanol |
| Initiator A | 8.78 | Photoinitiator, DETX (diethylthioxanthone) |
| Initiator B | 8.28 | Photoinitiator, EDAB (ethyl 4-dimethylaminobenzoate) |
| Inhibitor A | 0.07 | Light stabilizer TAOBN (1,4,4-trimethyl-2,3-diazabicyclo[3.2.2]non-2-ene-N,N'-dioxide |

Ag paste component
1. Ag paste A and B formulation (wt %)

| Ag paste A | Ag paste B | Description | |
|---|---|---|---|
| 23.27 | 23.27 | Organic Binder C | |
| 6.43 | 6.72 | Organic Binder D | |
| 1.96 | 1.89 | Monomer A | Monomer, TMPEOTA (trimethylolpropane ethoxytriacrylate) |
| 1.96 | 1.89 | Monomer C | polyester acrylate oligomer |
| 0.15 | 0.15 | Organic Additive A | Additive, malonic acid |
| 2.17 | 2.09 | Bi Frit B | |
| 64.06 | | Ag powder A | D50: 1.3 um spherical powder |
| | 63.99 | Ag powder B | D50: 2.0 um spherical powder |

| Organic binder | | | |
|---|---|---|---|
| Binder C | Binder D | Description | Chemical Name |
| 69.16 | 68.81 | Solvent A | Texanol |
| 26.05 | 25.92 | Acrylic Resin B | Acrylic resin MMA/ETHYL ACRYLATE/ BMA/MAA copolymer, Mw = ~30000, acid value = ~130 |
| 2.37 | 0.5 | Initiator A | Photoinitiator, DETX (diethylthioxanthone) |
| 2.37 | | Initiator B | Photoinitiator, EDAB (ethyl 4-dimethylaminobenzoate) |
| | 2.36 | Initiator C | Irgacure 907 (Ciba), 2-methyl-1-[4-(methylthio)phenyl]-2-morpholinopropan-1-one |
| | 2.36 | Initiator D | Irgacure 369 (Ciba), 2-benzyl-2-dimethylamino-1-(4-morpholinophenyl)butanone-1 |
| 0.05 | 0.05 | Inhibitor A | Stabilizer, TAOBN (1,4,4-trimethyl-2,3-diazabicyclo[3.2.2]non-2-ene-N,N'-dioxide) |

2. Ag paste C and D formulation (wt %)

| Ag paste C | Ag paste D | | |
|---|---|---|---|
| 18.65 | 18.65 | Organic Binder E | |
| 3.97 | 3.97 | Monomer A | Monomer, TMPEOTA (trimethylolpropane ethoxytriacrylate) |
| 4 | 4 | Solvent A | Texanol |
| 0.15 | 0.15 | Organic Additive C | Additive CBT (1H-benzotriazolecarboxylic acid) |
| 0.5 | 0.5 | Bi Frit B | |
| 71.34 | | Ag powder A | D50: 1.3 um spherical powder |
| | 71.34 | Ag powder B | D50: 2.0 um spherical powder |
| 0.5 | 0.5 | Additive D | Poly-methyl-alkyl-siloxane |

Organic binder E (N97M)

| Wt % | |
|---|---|
| 52.48 | Texanol |
| 36.01 | Acrylic resin MMA/ETHYL ACRYLATE/BMA/MAA copolymer, Mw = ~30000, acid value = ~130 |
| 5.72 | Irgacure 907 (Ciba), 2-methyl-1-[4-(methylthio)phenyl]-2-morpholinopropan-1-one |
| 5.72 | Irgacure 651 (Ciba), 2,2-dimethoxy-1,2-diphenylethan-1-one |
| 0.07 | Stabilizer, TAOBN (1,4,4-trimethyl-2,3-diazabicyclo[3.2.2]non-2-ene-N,N'-dioxide) |

Glass Frit Compositions in Weight Percent Total Glass Composition

| Glass Name | Pb Frit A | Pb Frit B | Bi Frit A | Bi Frit B | Bi Frit C | Bi Frit D | Bi Frit E | Bi Frit F | Bi Frit G |
|---|---|---|---|---|---|---|---|---|---|
| PbO | 77 | 62.1 | | | | | | | |
| Bi2O3 | | | 70.0 | 71.8 | 69.8 | 67.5 | 56.8 | 65 | 58.8 |
| SiO2 | 9.1 | 30.8 | 1.5 | 1.0 | 7.1 | 11.5 | 18.2 | 5 | 16.2 |
| Al2O3 | 1.4 | 2.6 | 0.5 | 0.5 | 2.1 | 1.5 | 2.3 | | 2.3 |
| B2O3 | 12.5 | 1.8 | 10.0 | 9.6 | 8.4 | 7.5 | 9.1 | 18 | 9.1 |
| ZnO | | 2.7 | 14.0 | 14.4 | 12.0 | 11.0 | 12.7 | | 12.7 |
| BaO | | | 4.0 | 2.9 | 0.5 | 1.0 | 0.9 | 12 | 0.9 |
| Total | 100 | 100 | 100 | 100 | 100 | 100 | 100 | 100 | 100 |
| D50 (um) | 0.9 | 0.9 | 0.8 | 0.6 | 0.9 | 0.9 | 0.9 | 1 | 0.9 |
| Ts (DTA) | 440 | 597 | 451 | 448 | 501 | 534 | 568 | 551 | 556 |

Ru Mixture A used in the examples is identified as $Pb_{0.75}Bi_{0.25}RuO_3$ pyrochlore with a surface area per weight ratio of 11 $m_2/g$. Ru Mixture B in the examples is identified as $BiRuO_3$ pyrochlore with a surface area per weight ratio of 10 $m_2/g$.

For the examples illustrated below, the electrode preparation conditions are as shown in Section (C) Preparation Conditions, (1)-(5), above.

Application Examples 1-6, Controls 1-2

The Ag conductive paste used in these examples was Ag paste A.

BiRu pyrochlore powder (Ru mixture B, specific surface area per weight ratio: 11 $m^2/g$) was combined with Bi glass powder having a different softening point, and paste samples of the compositions shown in Table 1 were prepared. Using the above processes (1)-(5), bus electrode-black electrode two layer test parts were prepared and investigated for various properties.

TABLE 1

| Ingredients | Control 1 | Control 2 | Example 1 | Example 2 | Example 3 | Example 4 | Example 5 | Example 6 |
|---|---|---|---|---|---|---|---|---|
| Organic binder A | 28.8 | 28.31 | 25.16 | 25.16 | 26.09 | 26.89 | 26.89 | 26.89 |
| monomer A | 7.2 | 7.08 | 6.29 | 6.29 | 6.52 | 6.72 | 6.72 | 6.72 |
| solvent A | 5.27 | 5.18 | 4.6 | 4.6 | 4.77 | 4.92 | 4.92 | 4.92 |
| Organic Additive A | 0.96 | 0.94 | 0.84 | 0.84 | 0.87 | 0.9 | 0.9 | 0.9 |
| Organic Additive B | 0.19 | 0.19 | 0.17 | 0.17 | 0.17 | 0.18 | 0.18 | 0.18 |
| Pb glass frit A | 16.32 | 16.04 | | | | | | |
| Pb glass frit B | 24 | 23.59 | | | | | | |
| Bi frit A | | | | 46.34 | | | | |
| Bi frit B | | | 46.34 | | | | | |
| Bi frit C | | | | | 44.36 | | | |
| Bi frit D | | | | | | 42.66 | | |
| Bi frit E | | | | | | | 42.66 | |
| Bi frit F | | | | | | | | 42.66 |
| Ru mixture A | 17.26 | | | | | | | |
| Ru mixture B | | 18.67 | 16.6 | 16.6 | 17.22 | 17.73 | 17.73 | 17.73 |

The Bi glasses in these black electrode examples were amorphous glass powders with a softening point in the range of 448-568° C. The photosensitive Ag paste used for the upper layer Ag electrode contained 60% of Ag powder (average particle diameter: about 2 μm) and 2% of Bi frit B having the lowest softening point of the glass powders selected.

Results are given in Table 2.

Results

Results are shown in Table 4. Table 4 also shows measurement results for a lead-containing black conductive composition similar to the above control 1 (control 1A).

TABLE 2

|  | Control 1 | Control 2 | Example 1 | Example 2 | Example 3 | Example 4 | Example 5 | Example 6 |
|---|---|---|---|---|---|---|---|---|
| Conductive | PbBiRu | BiRu | BiRu | BiRu | BiRu | BiRu | BiRu | BiRu |
| Frit Ts (DTA) | 540 (calc) | 540 (calc) | 448 | 478 | 501 | 534 | 568 | 551 |
| Dried Black thickness/um | 6.0 | 6.4 | 6.0 | 5.8 | 5.8 | 6.0 | 6.2 | 7.3 |
| Dried Ag/Black thickness/um | 12.8 | 13.3 | 12.9 | 13.0 | 13.0 | 13.1 | 13.3 | 13.5 |
| Line Resolution (um) | 40 | 40 | 40 | 30 | 30 | 40 | 40 | 40 |
| 4 mil line thickness/um | 6.0 | 7.0 | 6.0 | 6.0 | 6.5 | 7.0 | 6.0 | 7.0 |
| 4 mil line edge curl/um | 0.0 | 3.8 | 2.0 | 2.0 | 1.0 | 2.0 | Blister | 2.0 |
| Peeling | medium | slight | none | medium | slight | medium–large | medium–large | medium–large |
| L value Ag/Black two layer | 8.9 | 8.99 | 6.68 | 12.15 | 14.4 | 13.59 | 9.07 | 9.56 |
| L value of black 1 layer | 3.97 | 3.88 | 2.52 | 2.61 | 3.7 | 3.61 | 19.6 | 4.87 |
| Resistivity/mohm/sq @ 5 um | 9.9 | 14.3 | 13.8 | 15.7 | 16.5 | 18.8 | 20.1 | 21.6 |
| Black resistance (ohm) | 182k | 171k | 267k | 230k | 225k | 203k | 240k | 217k |

It was learned that compared with controls 1 and 2 (the lead-containing compositions), Examples 1-3 (which used lower softening point frit) performed well at this firing temperature (550° C.), i.e. practical black electrodes were formed. Examples 4-6 (which used higher softening point frit) did not perform so well in all aspects of testing. If examples 4-6 had been fired at a higher temperature, such as 600° C., they would have shown better performance.

Application Examples 7-13. Control 1a

The Ag conductive paste used in these examples was Ag paste A.

The Bi frit B showed good results in Application Examples 1-3; two types of glass with high softening points, judged as difficult to use alone, were used in weight ratios of 75/25, 50/50, and 25/75 wt %, with Bi frit B, to obtain black electrode samples (see Table 3). A two-layer evaluation was made in combination with the Ag electrode of Application Examples 1-3. A test was also conducted on a paste containing a Bi glass with a softening point near 550° C. (Example 7).

TABLE 3

| Ingredient | Example 7 | Example 8 75% BT26025 25% BD19 | Example 9 50% BT26025 50% BD19 | Example 10 25% BT26025 75% BD19 | Example 11 75% BT26025 25% BT192 | Example 12 50% BT26025 50% BT192 | Example 13 25% BT26025 75% BT192 |
|---|---|---|---|---|---|---|---|
| Organic binder B | 27.2 | 25.9 | 26.3 | 26.8 | 25.9 | 26.3 | 26.8 |
| monomer B | 6.8 | 6.46 | 6.57 | 6.69 | 6.46 | 6.57 | 6.69 |
| solvent A | 5 | 4.73 | 4.81 | 4.9 | 4.73 | 4.81 | 4.9 |
| Bi frit B |  | 35.7 | 24.2 | 12.3 | 35.7 | 24.2 | 12.3 |
| Bi frit D |  | 10.2 | 20.8 | 31.7 |  |  |  |
| Bi frit G | 43 |  |  |  |  |  |  |
| Bi frit E |  |  |  |  | 10.2 | 20.8 | 31.7 |
| Ru mixture B | 18 | 17 | 17.3 | 17.6 | 17 | 17.3 | 17.6 |
|  | 100 | 100 | 100 | 100 | 100 | 100 | 100 |

TABLE 4

|  | Example 7 | Example 8 | Example 9 | Example 10 | Example 11 | Example 12 | Example 13 | control 1A (Pb type) |
| --- | --- | --- | --- | --- | --- | --- | --- | --- |
| Conductive | BiRu | BiRu | BiRu | BiRu | BiRu | BiRu | BiRu | PbBiRu |
| Frit Ts (DTA) | 556 | 448/534 | 448/534 | 448/534 | 448/568 | 448/568 | 448/568 | 540 (calc) |
| Dried Black thickness/um | 4.0 | 4.2 | 4.1 | 4.0 | 3.9 | 3.8 | 4.0 | 5.0 |
| Dried Ag/Black thickness/um | 11.0 | 11.0 | 11.3 | 11.0 | 10.5 | 11.0 | 11.1 | 12.5 |
| Line Resolution (um) | 40 | 40 | 40 | 30 | 30 | 40 | 40 | 40 |
| 4 mil line thickness/um | 5.5 | 5.5 | 5.6 | 6.0 | 5.5 | 5.4 | 5.5 | 5.0 |
| 4 mil line edge curl/um | 2.6 | 2.5 | 2.5 | 4.3 | 3.3 | 2.5 | 2.4 | 1.1 |
| Peeling | medium | medium | medium | med–high | med–high | med–high | medium | low |
| L value Ag/Black two layer | 15.0 | 11.1 | 13.1 | 15.1 | 11.8 | 14.1 | 15.3 | 9.6 |
| L value of black 1 layer | 14.5 | 4.2 | 4.4 | 5.0 | 4.7 | 4.4 | 13.8 | 6.9 |
| Resistivity/mohm/sq @ 5 um | 22.4 | 22.6 | 17.6 | 21.5 | 18.0 | 15.7 | 20.1 | 11.5 |
| Black resistance (ohm) | 360k | 366k | 397k | 380k | 412k | 407k | 380k | 430k |

This data shows that low-softening-point glass can be mixed with different types of second Bi glass (high softening point), and give satisfactory performance. Varying the level of high and low softening point glass frits is an effective way achieving a desired balance of electrode properties. While some frit combinations did not perform so well at this firing temperature, at other firing temperatures, these frit combinations could perform well.

Application Examples 14-21 Control 1b

The Ag conductive paste used in these examples was Ag paste A.

In these examples, the BiRu pyrochlore level was varied from 13-25 volume percent of the inorganic content in the total composition. Examples 14-17 used Bi Frit B and examples 18-21 used high softening Bi Frit D. Compositions are given in Table 5.

Results

Results are given in Table 6. Table 6 also shows measurement results for a lead-containing black conductive composition similar to the above control 1 (control 1B).

TABLE 5

|  | sample | | | | | | | |
| --- | --- | --- | --- | --- | --- | --- | --- | --- |
| Ingredient | Example 14 BiRu 25 vol % | Example 15 BiRu 21 vol % | Example 16 BiRu 17 vol % | Example 17 BiRu 13 vol % | Example 18 BiRu 25 vol % | Example 19 BiRu 21 vol % | Example 20 BiRu 17 vol % | Example 21 BiRu 13 vol % |
| Organic binder A | 24.95 | 25.16 | 25.36 | 25.59 | 26.6 | 26.34 | 27.28 | 27.62 |
| monomer A | 6.24 | 6.29 | 6.34 | 6.39 | 6.65 | 6.74 | 6.82 | 6.91 |
| solvent A | 4.57 | 4.6 | 4.64 | 4.68 | 4.87 | 5.5 | 4.99 | 5.06 |
| Organic Additive A | 0.83 | 0.84 | 0.85 | 0.85 | 0.89 | 0.9 | 0.91 | 0.92 |
| Organic Additive B | 0.16 | 0.17 | 0.17 | 0.17 | 0.18 | 0.18 | 0.18 | 0.18 |
| Bi frit B | 43.59 | 46.33 | 49.03 | 51.85 | | | | |
| Bi frit D | | | | | 39.84 | 42.52 | 45.19 | 48 |
| Ru mixture B | 19.66 | 16.61 | 13.61 | 10.47 | 20.97 | 17.79 | 14.63 | 11.31 |
|  | 100.0 | 100.0 | 100.0 | 100.0 | 100.0 | 100.0 | 100.0 | 100.0 |

TABLE 6

|  | Example 14 | Example 15 | Example 16 | Example 17 | Example 18 | Example 19 | Example 20 | Example 21 | control 1B (Pb type) |
| --- | --- | --- | --- | --- | --- | --- | --- | --- | --- |
| Conductive | BiRu 25 vol % | BiRu 21 vol % | BiRu 17 vol % | BiRu 13 vol % | BiRu 25 vol % | BiRu 21 vol % | BiRu 17 vol % | BiRu 13 vol % | PbBiRu |

TABLE 6-continued

|  | Example 14 | Example 15 | Example 16 | Example 17 | Example 18 | Example 19 | Example 20 | Example 21 | control 1B (Pb type) |
|---|---|---|---|---|---|---|---|---|---|
| Frit Ts (DTA) | 448 | 448 | 448 | 448 | 534 | 534 | 534 | 534 | 540 (calc) |
| Dried Black thickness um | 4.5 | 5.0 | 5.0 | 4.9 | 5.3 | 5.3 | 5.0 | 5.2 | 5.0 |
| Dried Ag/Black thickness/um | 12.4 | 13.0 | 12.5 | 12.9 | 13.1 | 12.9 | 12.7 | 12.9 | 12.9 |
| Line Resolution (um) | 40 | 40 | 40 | 40 | 40 | 40 | 40 | 40 | 40 |
| 4 mil line thickness/um | 5.8 | 6.0 | 6.0 | 6.0 | 6.5 | 7.0 | 6.3 | 6.3 | 7.5 |
| 4 mil line edge curl/um | 2.5 | 2.8 | 2.8 | 2.8 | 3.8 | 4.5 | 4.3 | 3.5 | 2.5 |
| Peeling | medium | medium | medium | med–high | low | med–high | med/high | med/high | none |
| L value Ag/Black two layer | 5.5 | 7.0 | 11.7 | 15.6 | 13.7 | 15.3 | 16.0 | 19.2 | 9.2 |
| L value of black 1 layer | 3.7 | 3.0 | 5.2 | 9.1 | 4.4 | 5.1 | 8.7 | 18.4 | 5.4 |
| Resistivity/ mohm/sq @ 5 um | 14.1 | 12.9 | 11.0 | 15.8 | 19.4 | 20.3 | 16.8 | 17.2 | 9.3 |
| Black Resistance (Ohm) | 86k | 190k | 430k | 2M | 29k | 43k | 204k | 9.7 M | 754k |

Compositions based on Bi frit B performed better than compositions based on Bi frit D under these test conditions (firing at 550° C.). A higher firing temperature would be more appropriate for those compositions based on Bi frit D. The general tendency with variation (decrease) of the black conductive component content is that the L value increases and the resistance of the black conductive layer increases.

Application Examples 22-27 Control 1c

In these examples, Ag conductive pastes based on Ag paste A were prepared with different binder levels (0, 1 and 2 wt % Bi frit B), then evaluated in a two layer structure with black example pastes 15 or 19 (see above).

Results

Results are given in Table 7. The table also shows measurement results for a lead-containing black conductive composition similar to the above control 1 (control 1C).

The black electrode (example 15) using Bi frit B was not affected by changing the glass binder content in the Ag electrode. On the other hand, the electrodes formed from black electrode compositions using Bi frit D, which is a high-softening-point glass frit, were affected by the glass binder content in the Ag electrodes. Therefore, in the case of forming two-layer electrodes, not only the black conductive compositions, but also the high conduction layer (bus electrode) composition is important.

Application Examples 28-34

The Ag conductor paste used in these examples was Ag paste B.

An evaluation was made for effects of the specific surface area per weight ratio of BiRu pyrochlore used as the black conductive component. Using BiRu pyrochlore with different specific surface area per weight ratios (3.25-9.02 $m^2/g$), compositions shown in Table 8 were prepared.

TABLE 7

|  | Example 22 | Example 23 | Example 24 | Example 25 | Example 26 | Example 27 | control 1C (Pb type) |
|---|---|---|---|---|---|---|---|
| Glass binder % in Ag (upper layer) | 0% | 1% | 2% | 0% | 1% | 2% | 2% |
| Black Conductor Composition | Example 15 | Example 15 | Example 15 | Example 19 | Example 19 | Example 19 | Control 1c |
| Frit Ts (DTA) | 448 | 448 | 448 | 534 | 534 | 534 | 540 (calc) |
| Dried Black thickness/um | 5.0 | 5.0 | 5.0 | 5.3 | 5.3 | 5.3 | 5.0 |
| Dried Ag/Black thickness/um | 13.0 | 12.0 | 13.0 | 12.9 | 12.5 | 12.9 | 12.9 |
| Line Resolution (um) | 40 | 40 | 40 | 40 | 40 | 40 | 40 |
| 4 mil line thickness/um | 5.8 | 5.3 | 6.0 | 6.4 | 6.5 | 7.0 | 7.5 |
| 4 mil line edge curl/um | 2.3 | 2.5 | 2.8 | 1.8 | 3.5 | 4.5 | 2.5 |
| Peeling | medium | medium | medium | low | medium | med–high | none |
| L value Ag/Black two layer | 9.0 | 8.0 | 7.0 | 11.5 | 14.1 | 15.3 | 9.2 |
| Resistivity/mohm/sq @ 5 um | 11.5 | 10.7 | 12.9 | 8.2 | 16.5 | 20.3 | 9.3 |

TABLE 8

| Ingredient | Example 28 | Example 29 | Example 30 | Example 31 | Example 32 | Example 33 | Example 34 |
|---|---|---|---|---|---|---|---|
| Organic binder A | 27.5 | 27.5 | 27.5 | 27.5 | 27.5 | 27.5 | 27.5 |
| monomer A | 6 | 6 | 6 | 6 | 6 | 6 | 6 |
| solvent A | 4.55 | 4.55 | 4.55 | 4.55 | 4.55 | 4.55 | 4.55 |
| Organic Additive A | 0.8 | 0.8 | 0.8 | 0.8 | 0.8 | 0.8 | 0.8 |
| Organic Additive B | 0.15 | 0.15 | 0.15 | 0.15 | 0.15 | 0.15 | 0.15 |
| Bi frit B | 47 | 47 | 47 | 47 | 47 | 47 | 47 |
| Ru mixture B | 14 | | | | | | |
| SA = 3.25 m2/g | | | | | | | |
| SA = 4.04 | | 14 | | | | | |
| SA = 4.91 | | | 14 | | | | |
| SA = 5.71 | | | | 14 | | | |
| SA = 6.61 | | | | | 14 | | |
| SA = 7.86 | | | | | | 14 | |
| SA = 9.02 | | | | | | | 14 |
| | 100 | 100 | 100 | 100 | 100 | 100 | 100 |

Results
Results are shown in Table 9.

TABLE 9

| | Example 28 | Example 29 | Example 30 | Example 31 | Example 32 | Example 33 | Example 34 |
|---|---|---|---|---|---|---|---|
| Conductive | BiRu | BiRu | BiRu | BiRu | BiRu | BiRu | BiRu |
| Conductive Specific Surface Area to weight ratio m$^2$/g | 3.25 | 4.04 | 4.91 | 5.71 | 6.61 | 7.86 | 9.02 |
| Frit Ts (DTA) | 448 | 448 | 448 | 448 | 448 | 448 | 448 |
| Dried Black thickness/um | 3.9 | 4.2 | 3.6 | 3.6 | 4.2 | 3.5 | 4.6 |
| Dried Ag/Black thickness/um | 13.1 | 12.6 | 13.1 | 13.2 | 12.7 | 12.9 | 13.1 |
| Line resolution (um) | 30 | 30 | 30 | 30 | 30 | 30 | 30 |
| 4 mil line thickness/um | 6.7 | 7.0 | 6.2 | 5.7 | 5.8 | 5.7 | 6.3 |
| 4 mil line edge curl/um | 2.0 | 2.5 | 1.8 | 2.5 | 2.0 | 2.0 | 2.0 |
| Peeling | slight | slight | slight | slight | slight | medium | medium |
| L value Ag/Black two layer | 23.2 | 18.2 | 16.9 | 16.6 | 18.0 | 16.2 | 13.9 |
| L value of black 1 layer | 19.2 | 14.6 | 11.8 | 10.0 | 10.1 | 9.8 | 8.9 |
| Black/Ag resistivity/ mohm/sq @ 5 um | 13.4 | 13.2 | 13.1 | 13.4 | 14.1 | 13.9 | 14.8 |
| Black resistance (ohm) | >1 G | >1 G | >1 G | 10M | 740K | 380K | 210K |

With a BiRu pyrochlore specific surface area per weight ratio below 4.91 m$^2$/g, black resistance becomes >1 Gohm, with an increased L value. To reduce L value and black resistance (with reduced specific surface area per weight ratio pyrochlore) more pyrochlore content is required. Therefore, in the present invention, a surface area per weight ratio above 5 m$^2$/g is preferred, but not essential.

Application Examples 35-38

The Ag conductive paste used in these examples was Ag paste C.
An investigation was made on the effects of the inorganic solids content in the black electrode pastes. The inorganic solids content in the black electrode paste was varied at 60-15 wt % of the total paste composition. The BiRu pyrochlore/glass ratio was fixed at about 0.3. Compositions are shown in Table 10.

TABLE 10

| | Example 35 | Example 36 | Example 37 | Example 38 |
|---|---|---|---|---|
| % solids | 60 | 45 | 30 | 15 |
| Ingredient | | | | |
| Organic binder B | 27.6 | 37.86 | 48.44 | 58.7 |
| monomer B | 6.9 | 9.47 | 12.13 | 14.7 |
| solvent A | 5 | 6.85 | 8.75 | 10.6 |
| Organic Additive C | 0.5 | 0.67 | 0.84 | 1 |
| Bi frit B | 46.3 | 34.84 | 23.04 | 11.58 |
| Ru mixture B | 13.7 | 10.31 | 6.81 | 3.42 |
| | 100 | 100 | 100 | 100 |

Results
Results are shown in Table 11.

TABLE 11

|  | Example 35 | Example 36 | Example 37 | Example 38 |
|---|---|---|---|---|
| Conductive | BiRu | BiRu | BiRu | BiRu |
| Paste % solids | 60 | 45 | 30 | 15 |
| Frit Ts (DTA) | 448 | 448 | 448 | 448 |
| Dried Black thickness/um | 4.5 | 3.7 | 3.2 | 2.9 |
| Dried Ag/Black thickness/um | 13.3 | 12.8 | 12.0 | 12.2 |
| Line resolution | 70 | 110 | 110 | 110 |
| 4 mil line thickness/um | 7.0 | 6.0 | 6.0 | 5.0 |
| 4 mil line edge curl/um | 12.0 | 14.0 | 11.0 | 2.0 |
| Peeling | Slight | high | High | none |
| L value Ag/Black two layer | 17.3 | 20.0 | 29.6 | 44.5 |
| L value of black 1 layer | 5.0 | 16.7 | 38.1 | 63.6 |
| Black/Ag resistivity mohm/sq @ 5 um | 9.3 | 6.3 | 5.1 | 6.1 |
| Black resistance (ohm) | 1.2k | 2.9M | >1 G | >1 G |

As the inorganic solids content is reduced, blackness decreases and black resistance increases. At a inorganic solids content of 15 wt %, the blackness deteriorated greatly. However, at greater thickness, the inorganic solids content of 15 wt % could produce a satisfactory black color. In example 38, the BiRu pyrochlore conductive particle content was 3.42 wt %, which is on the lower edge of the conductive metal oxide particle component content range of 3-50 wt. %.

Application Examples 39-42

The Ag conductor paste used in these examples was Ag paste C.

An investigation was made of the properties of electrodes when the inorganic solids content in the black conductive compositions was varied from 40-15 wt % and the BiRu pyrochlore content fixed at 10 wt %. Compositions are shown in Table 12.

TABLE 12

|  | Example 39 | Example 40 | Example 41 | Example 42 |
|---|---|---|---|---|
| Solids Ingredient | 40 | 30 | 20 | 15 |
| Organic binder B | 41.4 | 48.30 | 55.20 | 58.7 |
| monomer B | 10.4 | 12.10 | 13.90 | 14.7 |
| solvent A | 7.5 | 8.80 | 10.00 | 10.6 |
| Organic Additive C | 0.7 | 0.80 | 0.90 | 1 |
| Bi frit B | 30 | 20.00 | 10.00 | 5 |
| Ru mixture B | 10 | 10.00 | 10.00 | 10 |
|  | 100 | 100 | 100 | 100 |

Results
Results are given in Table 13.

TABLE 13

|  | Example 39 | Example 40 | Example 41 | Example 42 |
|---|---|---|---|---|
| Conductive | BiRu | BiRu | BiRu | BiRu |
| Paste % solids | 40 | 30 | 20 | 15 |
| Frit Ts (DTA) | 448 | 448 | 448 | 448 |
| Dried Black thickness/um | 3.5 | 3.3 | 3.0 | 2.5 |

TABLE 13-continued

|  | Example 39 | Example 40 | Example 41 | Example 42 |
|---|---|---|---|---|
| Dried Ag/Black thickness/um | 12.9 | 12.4 | 12.1 | 11.8 |
| Line resolution | 50 | 40 | 50 | 50 |
| 4 mil line thickness/um | 5.8 | 6.0 | 5.8 | 6.0 |
| 4 mil line edge curl/um | 6.8 | 4.5 | 3.0 | 2.5 |
| Peeling | Slight | slight | slight | slight |
| L value Ag/Black two layer | 22.6 | 25.0 | 26.9 | 29.0 |
| L value of black 1 layer | 21.5 | 26.7 | 27.5 | 32.6 |
| Black/Ag Resistivity mohm/sq @ 5 um | 5.2 | 5.0 | 4.7 | 5.9 |
| Black resistance (ohm) | 5M | 1.9M | 6.4M | >1 G |

With conductive level at 10%, reasonable properties of the black electrode are achieved, over a range a glass content.

Application Examples 43-46

The silver paste used in these examples was Ag paste D.

An investigation was made of the properties of electrodes when the inorganic solids content in the black conductive compositions was fixed at 26 wt % and the BiRu pyrochlore content varied from 11-14 wt %. Compositions are shown in Table 14.

TABLE 14

|  | Example 43 | Example 44 | Example 45 | Example 46 |
|---|---|---|---|---|
| % conductive Ingredient | 10 | 12 | 13 | 14 |
| Organic binder B | 51 | 51 | 51 | 51 |
| monomer B | 12.8 | 12.8 | 12.8 | 12.8 |
| solvent A | 9.3 | 9.3 | 9.3 | 9.3 |
| Organic Additive C | 0.9 | 0.9 | 0.9 | 0.9 |
| Bi frit B | 15 | 14 | 13 | 12 |
| Ru mixture B | 11 | 12 | 13 | 14 |
|  | 100 | 100 | 100 | 100 |

Results
Results are given in Table 15.

TABLE 15

|  | Example 43 | Example 44 | Example 45 | Example 46 |
|---|---|---|---|---|
| Conductive | BiRu | BiRu | BiRu | BiRu |
| % Conductive | 11 | 12 | 13 | 14 |
| Frit Ts (DTA) | 448 | 448 | 448 | 448 |
| Dried Black thickness/um | 3.0 | 3.0 | 3.0 | 3.0 |
| Dried Ag/Black thickness/um | 12.1 | 12.0 | 12.0 | 12.1 |
| Line resolution | 80 | 80 | 80 | 70 |
| 4 mil line thickness/um | 7.0 | 6.3 | 6.5 | 6.8 |
| 4 mil line edge curl/um | 1.8 | 2.0 | 2.0 | 1.9 |
| Peeling | none | none | none | none |
| L value Ag/Black two layer | 26.7 | 24.3 | 23.3 | 22.7 |
| L value of black 1 layer | 22.9 | 19.8 | 17.6 | 17.0 |
| Black/Ag resistivity mohm/sq @ 5 um | 8.5 | 7.7 | 7.5 | 7.9 |
| Black resistance (ohm) | 150K | 70K | 40K | 21K |

In all cases, all properties were stable. At the L value of about 20, the conductive compositions for black electrodes used in the application examples appear to be practical.

Application Examples 47-50

The Ag conductor paste used in these examples was Ag paste D.

An investigation was made of the properties of electrodes when the inorganic solids content in the black conductive compositions was fixed at 32 wt % and the BiRu pyrochlore content varied from 14-19 wt %. Compositions are shown in Table 16.

TABLE 16

|  | Example 47 | Example 48 | Example 49 | Example 50 |
|---|---|---|---|---|
| % conductive Ingredient | 14 | 16 | 18 | 19 |
| Organic binder B | 46.89 | 46.89 | 46.89 | 46.89 |
| monomer B | 11.78 | 11.78 | 11.78 | 11.78 |
| solvent A | 8.52 | 8.52 | 8.52 | 8.52 |
| Organic Additive C | 0.81 | 0.81 | 0.81 | 0.81 |
| Bi frit B | 18 | 16 | 14 | 13 |
| Ru mixture B | 14 | 16 | 18 | 19 |
|  | 100 | 100 | 100 | 100 |

Results

Results are given in Table 17

TABLE 17

|  | Example 47 | Example 48 | Example 49 | Example 50 |
|---|---|---|---|---|
| Conductive | BiRu 14 | BiRu 16 | BiRu 18 | BiRu 19 |
| % Conductive | 448 | 448 | 448 | 448 |
| Frit | 3.0 | 3.0 | 3.0 | 3.0 |
| Frit Ts (DTA) | 12.1 | 12.0 | 12.0 | 12.0 |
| Line resolution | 70 | 70 | 60 | 70 |
| 4 mil line thickness/um | 7.0 | 7.2 | 7.0 | 7.5 |
| 4 mil line edge curl/um | 0.0 | 0.5 | 0.3 | 1.0 |
| Peeling | low | low | none | none |
| L value Ag/Black two layer | 21.0 | 20.1 | 19.3 | 18.0 |
| L value of black 1 layer | 16.6 | 13.5 | 12.9 | 14.2 |
| Black/Ag resistivity/ mohm/sq @ 5 um | 8.1 | 7.5 | 7.2 | 7.5 |
| Black resistance (ohm) | 60K | 25K | 15K | 10K |

Within the range of inorganic solids content shown in these examples, very practical black electrodes with L value below 20 can be designed.

The above examples show that the lead-free black conductive compositions of the present invention maintain a good balance of all properties desired for black electrodes.

Examples For Single Layer "Bus" (SLB) Electrodes

Examples 50-88 were prepared to represent various embodiments of compositions for use in the formation of single layer bus electrodes.

Preparation of Photosensitive Wet-developable Pastes (A) Preparation of Organic Materials The solvent and acrylic polymer were mixed, stirred, and heated to 100° C. to complete dissolution of the binder polymer. The resulting solution was cooled to 80° C., treated with the remaining organic components, stirred to complete the dissolution of all solids, passed through a 325-mesh filter screen, and cooled.

(B) Preparation of Paste

The paste was prepared by mixing an organic carrier, one or more monomers, and other organic components in a mixing vessel under yellow light. The inorganic materials were then added to the mixture of organic components. The entire composition was then mixed until the inorganic particles were wetted with the organic material. This mixture was roll-milled using a 3-roll mill. The resulting paste was used as obtained or was passed through a 635-mesh filter screen. At this point, the paste viscosity was adjusted by carriers or solvents to a viscosity most suitable for optimum processing.

Care was taken to avoid dirt contamination in the process of preparing paste compositions and in preparing parts, since such contamination can lead to defects.

(C) Preparation Conditions (1) Formation of SLB Electrode

Depending on the composition and desired thickness after drying, the paste was applied to an ITO film-free glass substrate by screen printing, using a 200-400 mesh screen. The example SLB pastes were applied to the glass substrates by screen printing, using a 400 mesh stainless steel screen. Parts were dried at 100° C. for 20 min in a IR drier resulting in a dry film thickness of 8-12 μm.

(2) UV Pattern Exposure

The dried SLB parts were exposed through a phototool using a collimated UV lightsource, Illumination: 5-20 mW/cm$^2$. Exposure energy: 600 mj/cm$^2$; on contact exposure, mask-coating gap: zero μm).

(3) Development

The exposed part was placed on a conveyor, then led into a spray developer containing a 0.4 wt % sodium carbonate aqueous solution as the developer solution. The developer solution temperature was maintained at 30° C., and sprayed at 10-20 psi. The part was subjected to a development time of 9-15 seconds (corresponding to 1.5 times time to clean—TTC). The developed part was dried by blowing off the excess water in a forced air stream.

(4) Firing

The dried parts were then fired in a belt furnace in an air atmosphere using a ×1.0 hr profile, reaching a peak temperature of 580° C.

(5) TOG (Transparent Overglaze Paste) Printing and Firing.

TOG paste (Typical Pb based TOG used in PDP industry) was applied to parts prepared in (4) by screen printing, using a 250 mesh stainless steel screen. A Pb-free TOG paste may also be used. The TOG pattern covered the entire SLB electrode pattern prepared in (4). Parts were dried at 150° C. for 10 min in a hot-air circulation oven resulting in a dry TOG film thickness of 20-30 μm. Parts with TOG were then fired in a belt furnace in an air atmosphere using a 2.0 hr profile, reaching a peak temperature of 580° C.

EXAMPLES

In the examples illustrated below, the constitutional components are shown in wt %.

Test Procedures

Dried SLB Thickness

The dry film thickness of the SLB electrode was measured at four different points using a contact profilometer, such as a Tencor Alpha Step 2000.

Line Resolution

Imaged samples were inspected using a zoom microscope at a minimum magnification of 20× with 10× oculars. The finest group of lines, which are completely intact without any shorts (connections between the lines) or opens (complete breaks in a line), was the stated line resolution for that sample.

Fired 4 mil Line Thickness

The fired film thickness was measured on the 4 mil width lines that were used to measure resistivity. Measurement was made using a contact profilometer.

4 mil Line Edge Curl

When the 4 mil line film thickness was measured, the devil's horn-shaped protrusion of the edges was observed in some cases, and the length of this devil's horn is called edge curl. With a large edge curl, the effective TOG (Transparent Overglaze) film thickness is decreased (transparent overglaze material is formed by printing, lamination, or coating, then firing) this leads to the possibility of dielectric breakdown, thus edge curl is not desired. No edge curl, i.e., edge curl being 0 μm, is most desirable. It is known that even with most well-used lead-containing conductive compositions, the edge curl is typically about 1-3 μm.

L Value of SLB (without TOG)

An ITO film-free glass substrate was coated with a SLB electrode as in (1) above and dried. Omitting each of the processes (2) and (3), the dry black electrode thus obtained was fired under the same conditions of the process of (4) to form a single solid fired black SLB electrode layer. After firing, the blackness viewed from the back of the glass substrate was measured (L-value of SLB). For blackness, the color (L*) was measured using a spectro color meter SE2000 from Nippon Denshoku with calibration using a standard white plate, with 0 being pure black and 100 pure white.

L Value of SLB (with TOG)

L-value of parts with TOG was also measured. The TOG was applied as detailed in (6) above. After TOG firing, the blackness viewed from the back of the glass substrate is measured (L-value of SLB with TOG).

SLB Resistivity (m ohm/sq@5 μm)

This is the sheet resistance value (mΩ/sq) per unit of fired film thickness (5 μm). This was measured on the 4 mil lines. This value equates to 2 times the so-called specific resistance (μΩ-cm). The lower this value, the better. The SLB resistivity without TOG was measured on parts prepared using process (1) through (4) above. The SLB resistivity with TOG was measured on parts prepared using process (1) through (5) above.

Glossary

Compositions of each component used in the examples of this specification are given below.

Organic Components

Organic binder F, A & G—weight percent total organic binder (see details below). Composition in weight percent total organic binder composition.

| Weight % | Organic Binder | | | |
|---|---|---|---|---|
| | F | A | G | |
| Acrylic Resin A | 36.14 | 34.78 | | Acrylic resin (Carboset XPD1234), methyl methacrylate 75%, methacrylic acid 25%, Mx = ~7000, Tg = 120 deg C., acid value = 164 |
| Acrylic Resin C | | | 36.16 | Acrylic resin (Carboset XPD1708C), methyl methacrylate 80%, methacrylic acid 20%, |
| Solvent A | 55.4 | 46.64 | 55.27 | Texanol |
| Resin B | 1.53 | 1.46 | 1.53 | PVP/VA, vinylpyrrolidone-vinyl acetate copolymer |
| Initiator A | 2.15 | 8.78 | 2.27 | Photoinitiator, DETX (diethylthioxanthone) |
| Initiator B | 2.15 | 8.28 | 2.15 | Photoinitiator, EDAB (ethyl 4-dimethyaminobenzoate) |
| Initiator C | 2.56 | | | Photoinitiator, Irgacure 907 (Ciba Geigy Corp) |
| Initiator E | | | 2.55 | Photoinitiator, Irgacure 651 (Ciba Geigy Corp) |
| Inhibitor A | 0.07 | 0.06 | 0.07 | Light Stabilizer, TAOBN (1,4,4-trimethyl-2,3-diazabicyclo[3.2.2]non-2-ene-N,N'-dioxide) |

| | |
|---|---|
| Monomer A | Monomer, Sartomer Co, Inc. SR454 Ethoxylated$_3$ Trimethylolpropane Triacrylate |
| Monomer D | Monomer, Saromer Co, Inc. SR492 Propoxylated$_3$ Trimethylolpropane Triacrylate |
| Monomer C | Polyester Acrylate Oligomer |
| Additive A | Additive, Malonic Acid |
| Additive B | Additive, BHT |
| Additive D | Additive, Poly-methyl-alkyl-siloxane |

Inorganic Components

| | |
|---|---|
| Ag Powder A | Microtrac PSD D50: 1.3 um SA 0.6 m$^2$/g spherical powder |
| Ag Powder B | Microtrac PSD D50: 2.0 um SA 0.4 m$^2$/g spherical powder |

| | |
|---|---|
| Ru Mixture B | BiRuO3 Pyrochlore. SA = 10 m²/g |
| Pigment A | Black Pigment. Cobalt Oxide powder Microtrac PSD D50 = 0.7 um |
| Pigment B | Black Pigment. Cr—Fe—Co Oxide powder Microtrac PSD D50 = 0.9 um |
| Pigment C | Black Pigment. Cr—Cu—Co Oxide powder Microtrac PSD D50 = 0.65 um |
| Pigment D | Black Pigment. Cr—Cu—Mn Oxide powder Microtrac PSD D50 = 0.75 um |

Glass Composition (wt % total glass composition) - Bi Frit B

| Bi2O3 | SiO2 | Al2O3 | B2O3 | ZnO | BaO | PSD D50 | Ts (DTA) |
|---|---|---|---|---|---|---|---|
| 71.6 | 1.0 | 0.5 | 9.6 | 14.4 | 2.9 | 0.6 um | 448 C |

Application Examples 50-60

Paste samples were prepared with Ru Mixture B, Bi frit B, and Ag powder B.

The purpose was to investigate the how the SLB electrode properties change as Ag/Ru.Mixture.B/frit ratios are changed. Compositions are given in weight percent total paste composition.

Ag powder ranges from 48.7 to 59%

Bi frit B level ranges from 2.9 to 9.8% and

Ru.Mixture.B level ranges from 1 to 7.3%

Compositions are Shown in Table 18-1

TABLE 18-1

Recipe - effect of Ag + Ru Mixture B + frit

| | Example | | | | | | | | | |
|---|---|---|---|---|---|---|---|---|---|---|
| | 51 | 52 | 53 | 54 | 55 | 56 | 57 | 58 | 59 | 60 |
| Organic Binder F | 15.2 | 15.2 | 15.2 | 16.3 | 17.4 | 18.4 | 18.4 | 18.4 | 16.8 | 16.8 |
| Organic Binder A | 6.2 | 6.2 | 6.2 | 5.1 | 4.1 | 3.1 | 3.1 | 3.1 | 4.6 | 4.6 |
| Organic Binder G | 6.2 | 6.2 | 6.2 | 5.2 | 4.1 | 3.1 | 3.1 | 3.1 | 4.7 | 4.7 |
| Monomer D | 2.6 | 2.6 | 2.6 | 2.8 | 3.0 | 3.2 | 3.2 | 3.2 | 2.9 | 2.9 |
| Monomer C | 3.5 | 3.5 | 3.5 | 3.3 | 3.1 | 2.9 | 2.9 | 2.9 | 3.2 | 3.2 |
| Monomer A | 0.85 | 0.85 | 0.85 | 0.71 | 0.57 | 0.43 | 0.43 | 0.43 | 0.64 | 0.64 |
| Additive D | 0.06 | 0.06 | 0.06 | 0.07 | 0.07 | 0.08 | 0.08 | 0.08 | 0.07 | 0.07 |
| Solvent A | 2.5 | 2.5 | 2.5 | 2.6 | 2.6 | 2.6 | 2.6 | 2.6 | 2.6 | 2.6 |
| Additive A | 0.31 | 0.31 | 0.31 | 0.29 | 0.28 | 0.26 | 0.26 | 0.26 | 0.28 | 0.28 |
| Additive B | 0.17 | 0.17 | 0.17 | 0.17 | 0.17 | 0.17 | 0.17 | 0.17 | 0.17 | 0.17 |
| Ag Powder B | 48.8 | 48.8 | 48.8 | 52.2 | 55.6 | 59.0 | 59.0 | 59.0 | 53.9 | 53.9 |
| Ru Mixture B | 3.8 | 5.0 | 6.3 | 4.2 | 3.3 | 1.9 | 2.5 | 3.1 | 1.0 | 7.3 |
| Bi Frit B | 9.8 | 8.5 | 7.3 | 7.1 | 5.7 | 4.9 | 4.2 | 3.6 | 9.1 | 2.9 |

Using the above processes (1)-(5), SLB electrode test parts were prepared and investigated for various properties.

Results obtained are shown in table 18-2.

TABLE 18-2

Data - effect of Ag + Ru Mixture B + Frit (Weight percent total composition)

| | Example | | | | | | | | | |
|---|---|---|---|---|---|---|---|---|---|---|
| | 51 | 52 | 53 | 54 | 55 | 56 | 57 | 58 | 59 | 60 |
| Sheet resistivity of SLB fired (mOhm/sq @ 5 um) | 34.3 | 42.9 | 55.1 | 31.8 | 23.0 | 14.9 | 17.3 | 18.6 | 10.3 | 61.5 |
| Sheet resistivity of SLB + TOG fired (mOhm/sq @ 5 um) | 29.1 | 39.4 | 47.6 | 28.4 | 21.4 | 14.2 | 14.3 | 20.9 | 10.2 | 47.9 |
| L-value of SLB fired | 39.9 | 38.4 | 36.2 | 41.7 | 45.5 | 50.9 | 49.6 | 47.8 | 51.0 | 37.1 |
| L-value of SLB + TOG fired | 26.2 | 23.1 | 21.2 | 25.9 | 28.1 | 34.4 | 31.4 | 29.2 | 46.6 | 23.8 |
| Dried thickness (um) | 9.5 | 9.9 | 9.6 | 10.0 | 10.0 | 10.0 | 9.9 | 10.0 | 10.0 | 10.0 |
| Fired thickness (um) | 4.9 | 5.3 | 5.2 | 5.5 | 5.5 | 5.3 | 5.4 | 5.3 | 4.2 | 5.8 |
| Edge curl (um) | 2.7 | 3.6 | 4.1 | 3.1 | 2.8 | 2.2 | 2.1 | 2.4 | 2.1 | 1.8 |
| Line resolution (um) | 40 | 40 | 40 | 40 | 40 | 40 | 40 | 40 | 40 | 40 |

All examples have acceptable line resolution and edge curl.

L-value and resisitivity were both improved when TOG was fired over the SLB electrode.

L-value+TOG ranges from 21 to 47, while resistivity ranges from 10 to 48 mOhm/sq@5 um. SLB electrodes with low L tend to have higher resistivity, SLB electrodes with high L have lower resistivity.

Application Examples 61-68

Examples 61-68 looked at the effect of using Pigment A in SLB recipes and no Ru Mixture B.

Paste samples were prepared with Pigment A, Bi frit B, and Ag powder B.

The purpose was to investigate the how the SLB electrode properties change as Ag/Pigment A/frit ratios are changed.

Ag powder ranges from 52.6 to 56%
Bi frit B level ranges from 2.3 to 9.0% and
Pigment A level ranges from 1.1 to 8.0%

Compositions, based on weight percent total composition, are shown in table 19-1.

TABLE 19-1

| | Recipe - Ag + Pigment A + Frit | | | | | | | |
|---|---|---|---|---|---|---|---|---|
| | Example | | | | | | | |
| | 61 | 62 | 63 | 64 | 65 | 66 | 67 | 68 |
| Organic Binder F | 17.5 | 17.5 | 16.4 | 16.5 | 17.0 | 17.0 | 16.9 | 17.0 |
| Organic Binder A | 4.1 | 4.1 | 5.2 | 5.2 | 4.7 | 4.7 | 4.6 | 4.7 |
| Organic Binder G | 4.2 | 4.2 | 5.2 | 5.2 | 4.7 | 4.7 | 4.7 | 4.7 |
| Monomer D | 3.0 | 3.0 | 2.8 | 2.8 | 2.9 | 2.9 | 2.9 | 2.9 |
| Monomer C | 2.5 | 2.4 | 2.6 | 2.4 | 2.5 | 2.4 | 3.1 | 2.1 |
| Monomer A | 0.57 | 0.57 | 0.72 | 0.72 | 0.64 | 0.64 | 0.64 | 0.65 |
| Additive D | 0.07 | 0.07 | 0.07 | 0.07 | 0.07 | 0.07 | 0.07 | 0.07 |
| Solvent A | 2.6 | 2.6 | 2.6 | 2.6 | 2.6 | 2.6 | 2.6 | 2.6 |
| Additive A | 0.28 | 0.28 | 0.29 | 0.29 | 0.29 | 0.29 | 0.28 | 0.29 |
| Additive B | 0.17 | 0.17 | 0.17 | 0.17 | 0.17 | 0.17 | 0.17 | 0.17 |
| Ag powder B | 56.0 | 56.0 | 52.6 | 52.7 | 54.3 | 54.4 | 54.0 | 54.5 |
| Bi Frit B | 4.5 | 3.6 | 5.7 | 4.6 | 5.1 | 4.1 | 9.0 | 2.3 |
| Pigment A | 4.5 | 5.4 | 5.7 | 6.8 | 5.1 | 6.1 | 1.1 | 8.0 |

Using the above processes (1)-(5), SLB electrode test parts were prepared and investigated for various properties.

Results obtained are shown in table 19-2 in weight percent total composition.

TABLE 19-2

| | Data - Ag + Pigment A + Frit | | | | | | | |
|---|---|---|---|---|---|---|---|---|
| | Example | | | | | | | |
| | 61 | 62 | 63 | 64 | 65 | 66 | 67 | 68 |
| Sheet resistivity of SLB fired (mOhm/sq @ 5 um) | 10.0 | 11.3 | 14.5 | 14.9 | 11.8 | 13.0 | 7.4 | 22.9 |
| Sheet resistivity of SLB + TOG fired (mOhm/sq @ 5 um) | 9.7 | 10.9 | 13.9 | 14.3 | 11.8 | 13.0 | 7.4 | 22.9 |
| L-value of SLB fired | 48.0 | 45.6 | 44.4 | 44.7 | 46.0 | 45.9 | 54.3 | 44.4 |
| L-value of SLB + TOG fired | 35.9 | 33.9 | 29.8 | 33.9 | 34.6 | 31.2 | 51.5 | 31.3 |
| Dried thickness (um) | 10.0 | 10.0 | 10.0 | 10.0 | 10.2 | 10.2 | 10.1 | 10.2 |
| Fired thickness (um) | 4.5 | 4.6 | 4.7 | 5.0 | 4.7 | 4.9 | 3.9 | 5.6 |
| Edge curl (um) | 2.9 | 2.8 | 3.4 | 3.5 | 2.7 | 3.4 | 1.9 | 2.8 |
| Line resolution (um) | 40 | 40 | 40 | 40 | 40 | 40 | 40 | 40 |

All examples have acceptable line resolution and edge curl.

L-value and resisitivity are both improved when TOG is fired over the SLB electrode.

L-value+TOG ranges from 29.8 to 51.5, while resistivity ranges from 7.4 to 22.9 mOhm/sq@5 um. SLB electrodes with low L tend to have higher resistivity, SLB electrodes with high L have lower resistivity.

Application Examples 69-73

Paste samples were prepared with Ru Mixture B, Pigment A, Bi frit B, and Ag powders A & B.

The purpose was to investigate the SLB electrode properties of compositions containing both Ru Mixture B and Pigment A.

Compositions are shown in table 20-1.

TABLE 20-1

Recipe - Ag + Ru Mixture B + Pigment A + Frit

| | Example | | | | |
|---|---|---|---|---|---|
| | 69 | 70 | 71 | 72 | 73 |
| Organic Binder F | 15.3 | 16.9 | 16.9 | 16.4 | 16.4 |
| Organic Binder A | 6.2 | 4.6 | 4.6 | 5.2 | 5.2 |
| Organic Binder G | 6.2 | 4.7 | 4.7 | 5.2 | 5.2 |
| Monomer D | 2.6 | 2.9 | 2.9 | 2.8 | 2.8 |
| Monomer C | 3.3 | 2.7 | 2.9 | 2.8 | 2.8 |
| Monomer A | 0.9 | 0.6 | 0.6 | 0.7 | 0.7 |
| Additive D | 0.07 | 0.07 | 0.07 | 0.07 | 0.07 |
| Solvent A | 2.5 | 2.6 | 2.6 | 2.6 | 2.4 |
| Additive A | 0.31 | 0.29 | 0.28 | 0.29 | 0.29 |
| Additive B | 0.17 | 0.17 | 0.17 | 0.17 | 0.17 |
| Ag Powder B | 48.9 | 54.2 | 54.1 | 39.4 | 26.2 |
| Ag powder A | | | | 13.1 | 26.4 |
| Ru Mixture B | 3.8 | 3.0 | 3.0 | 3.0 | 3.0 |
| Bi Frit B | 8.4 | 3.6 | 4.9 | 4.7 | 4.7 |
| Pigment A | 1.4 | 3.6 | 2.3 | 3.6 | 3.6 |

Using the above processes (1)-(5), SLB electrode test parts were prepared and investigated for various properties.

Results obtained are shown in table 20-2.

TABLE 20-2

Data - Ag + Ru Mixture B + Pigment A + Frit

| | Example | | | | |
|---|---|---|---|---|---|
| | 69 | 70 | 71 | 72 | 73 |
| Sheet resistivity of SLB fired (mOhm/sq @ 5 um) | 36.8 | 32.4 | 27.0 | 32.6 | 28.7 |
| Sheet resistivity of SLB + TOG fired (mOhm/sq @ 5 um) | 32.4 | 30.0 | 24.3 | 28.7 | 26.0 |
| L-value of SLB fired | 38.7 | 41.2 | 42.6 | 40.7 | 41.1 |
| L-value of SLB + TOG fired | 25.2 | 23.4 | 25.6 | 24.0 | 25.1 |
| Dried thickness (um) | 10.0 | 10.0 | 10.0 | 10.0 | 10.0 |
| Fired thickness (um) | 5.6 | 6.1 | 5.6 | 5.7 | 5.8 |
| Edge curl (um) | 3.4 | 3.6 | 3.1 | 3.8 | 3.8 |
| Line resolution (um) | 40 | 40 | 40 | 40 | 40 |

Acceptable SLB electrode properties are obtained with pastes made using a mixture of Ru Mixture B and Pigment A.

Application Examples 74-83

Paste samples were prepared with Bi frit B, Ru Mixture B or Pigment A, Ag powder A or blends of Ag powders A & B.

The purpose was to investigate the SLB electrode properties of compositions containing both Ag powder A and Ag powder B Compositions are shown in table 21-1.

TABLE 21-1

Recipe - Ag blends + (Pigment A or Ru Mixture B) + Frit

| | Example | | | | | | | | | |
|---|---|---|---|---|---|---|---|---|---|---|
| | 74 | 75 | 76 | 77 | 78 | 79 | 80 | 81 | 82 | 83 |
| Organic Binder F | 16.3 | 16.3 | 16.8 | 16.8 | 17.0 | 17.0 | 16.8 | 16.8 | 17.0 | 17.0 |
| Organic Binder A | 5.1 | 5.1 | 4.6 | 4.6 | 4.7 | 4.7 | 4.6 | 4.6 | 4.7 | 4.7 |
| Organic Binder G | 5.2 | 5.2 | 4.7 | 4.7 | 4.7 | 4.7 | 4.7 | 4.7 | 4.7 | 4.7 |
| Monomer D | 2.8 | 2.8 | 2.9 | 2.9 | 2.9 | 2.9 | 2.9 | 2.9 | 2.9 | 2.9 |
| Monomer C | 3.3 | 3.3 | 3.2 | 3.2 | 2.5 | 2.4 | 3.2 | 3.2 | 2.5 | 2.4 |
| Monomer A | 0.71 | 0.71 | 0.64 | 0.64 | 0.64 | 0.64 | 0.64 | 0.64 | 0.64 | 0.64 |
| Additive D | 0.07 | 0.07 | 0.07 | 0.07 | 0.07 | 0.07 | 0.07 | 0.07 | 0.07 | 0.07 |
| Solvent A | 2.6 | 2.6 | 2.6 | 2.6 | 2.6 | 2.6 | 2.6 | 2.6 | 2.6 | 2.6 |
| Additive A | 0.29 | 0.29 | 0.28 | 0.29 | 0.29 | 0.29 | 0.28 | 0.28 | 0.29 | 0.29 |
| Additive B | 0.17 | 0.17 | 0.17 | 0.17 | 0.17 | 0.17 | 0.17 | 0.17 | 0.17 | 0.17 |
| Ag Powder B | 26.1 | | 27.0 | 27.0 | 27.2 | 27.2 | 40.5 | 40.5 | 40.8 | 40.8 |
| Ag Powder A | 26.1 | 52.2 | 27.0 | 27.0 | 27.2 | 27.2 | 13.5 | 13.5 | 13.6 | 13.6 |
| Pigment A | | | | | 5.1 | 6.1 | | | 5.1 | 6.1 |
| Ru Mixture B | 4.2 | 4.2 | 4.7 | 5.6 | | | 4.7 | 5.6 | | |
| Bi Frit B | 7.1 | 7.1 | 5.4 | 4.5 | 5.1 | 4.1 | 5.4 | 4.5 | 5.1 | 4.1 |

Using the above processes (1)-(5), SLB electrode test parts were prepared and investigated for various properties.
Results obtained are shown in table 21-2.

TABLE 21-2

Data - Ag blends + (Pigment A or Ru Mixture B) + Frit

| | Example | | | | | | | | | |
|---|---|---|---|---|---|---|---|---|---|---|
| | 74 | 75 | 76 | 77 | 78 | 79 | 80 | 81 | 82 | 83 |
| Sheet resistivity of SLB fired (mOhm/sq @ 5 um) | 25.2 | 23.2 | 28.4 | 33.5 | 9.0 | 10.8 | 30.7 | 36.8 | 9.5 | 12.0 |

TABLE 21-2-continued

Data - Ag blends + (Pigment A or Ru Mixture B) + Frit

| | Example | | | | | | | | | |
|---|---|---|---|---|---|---|---|---|---|---|
| | 74 | 75 | 76 | 77 | 78 | 79 | 80 | 81 | 82 | 83 |
| Sheet resistivity of SLB + TOG fired (mOhm/sq @ 5 um) | 22.6 | 20.9 | 25.3 | 29.2 | 8.7 | 10.5 | 27.4 | 32.1 | 9.1 | 11.8 |
| L-value of SLB fired | 42.0 | 42.4 | 41.6 | 41.8 | 47.4 | 46.7 | 41.5 | 39.6 | 46.4 | 45.6 |
| L-value of SLB + TOG fired | 26.3 | 27.6 | 25.8 | 24.1 | 37.9 | 33.4 | 25.5 | 23.6 | 35.8 | 32.2 |
| Dried thickness (um) | 10.0 | 10.0 | 10.0 | 10.2 | 10.0 | 10.4 | 10.0 | 10.2 | 10.4 | 10.8 |
| Fired thickness (um) | 5.4 | 5.4 | 5.8 | 5.8 | 4.3 | 4.9 | 5.8 | 6.1 | 4.4 | 5.2 |
| Edge curl (um) | 3.9 | 3.9 | 3.3 | 2.7 | 3.3 | 3.3 | 3.2 | 3.3 | 3.5 | 4.1 |
| Line resolution (um) | 40 | 40 | 40 | 40 | 40 | 40 | 40 | 40 | 40 | 40 |

Acceptable SLB electrode properties are obtained with pastes made using a Ag powders A and B.

Application Examples 84-88

Paste samples were prepared with Bi frit B, Ag powder B and either Ru Mixture B or Pigments A, B, C or D.

The purpose was to investigate the SLB electrode properties of compositions containing a variety of pigments.

Compositions, based on weight percent total composition, are shown in table 22-1.

TABLE 22-1

Recipe - Ag + Frit + Ru Mixture B or Pigment A, B, C, or D

| | Example | | | | |
|---|---|---|---|---|---|
| | 84 | 85 | 86 | 87 | 88 |
| Organic Binder F | 16.8 | 17.0 | 16.8 | 16.8 | 16.8 |
| Organic Binder A | 4.6 | 4.7 | 4.6 | 4.6 | 4.6 |
| Organic Binder G | 4.7 | 4.7 | 4.7 | 4.7 | 4.7 |
| Monomer D | 2.9 | 2.9 | 2.9 | 2.9 | 2.9 |
| Monomer C | 3.2 | 2.5 | 3.2 | 3.2 | 3.2 |
| Monomer A | 0.64 | 0.64 | 0.64 | 0.64 | 0.64 |
| Additive D | 0.07 | 0.07 | 0.07 | 0.07 | 0.07 |
| Solvent A | 2.6 | 2.6 | 2.6 | 2.6 | 2.6 |
| Additive A | 0.28 | 0.29 | 0.28 | 0.28 | 0.28 |
| Additive B | 0.17 | 0.17 | 0.17 | 0.17 | 0.17 |
| Ag Powder B | 53.9 | 54.3 | 53.9 | 53.9 | 53.9 |
| Bi Frit B | 5.5 | 5.1 | 4.5 | 4.5 | 4.5 |
| Pigment C | | | 5.6 | | |
| Ru Mixture B | 4.7 | | | | |
| Pigment A | | 5.1 | | | |
| Pigment B | | | | 5.6 | |
| Pigment D | | | | | 5.6 |

Using the above processes (1)-(5), SLB electrode test parts were prepared and investigated for various properties.

Results obtained are shown in table 22-2.

TABLE 22-2

Data - Ag + Frit + Ru Mixture B or Pigment A, B, C, or D

| | Example | | | | |
|---|---|---|---|---|---|
| | 84 | 85 | 86 | 87 | 88 |
| Sheet resistivity of SLB fired (mOhm/sq @ 5 um) | 29.6 | 11.8 | 15.5 | 19.2 | 28.9 |
| Sheet resistivity of SLB + TOG fired (mOhm/sq @ 5 um) | 28.0 | 11.4 | 17.1 | 19.2 | 27.3 |
| L-value of SLB fired | 41.5 | 46.0 | 44.3 | 41.8 | 41.0 |

TABLE 22-2-continued

Data - Ag + Frit + Ru Mixture B or Pigment A, B, C, or D

| | Example | | | | |
|---|---|---|---|---|---|
| | 84 | 85 | 86 | 87 | 88 |
| L-value of SLB + TOG fired | 25.0 | 34.6 | 31.1 | 30.1 | 27.6 |
| Dried thickness (um) | 10.0 | 10.2 | 10.3 | 10.4 | 10.2 |
| Fired thickness (um) | 5.4 | 4.7 | 5.0 | 5.5 | 5.9 |
| Edge curl (um) | 3.0 | 2.7 | 4.2 | 3.6 | 3.3 |
| Line resolution (um) | 40 | 40 | 40 | 40 | 40 |

Acceptable SLB electrode properties are obtained with pastes made using a variety of pigment types.

What is claimed is:

1. A black conductive composition comprising, based on the total composition weight percent:
   40-70 weight percent of conductive metal particles selected from the group consisting of gold, silver, platinum, palladium, copper and mixtures thereof;
   0.5 to less than 3 weight percent of conductive metal oxide particles selected from the group consisting of $RuO_2$, ruthenium polyoxide, and mixtures thereof;
   25-59 weight percent organic matter comprising organic polymer binder and organic solvent; and
   0.5-20 weight percent of one or more lead-free bismuth glass binders wherein said glass binder comprises, based on weight percent total glass binder composition: 55-85% $Bi_2O_3$, 0-20% $SiO_2$, 0-5% $Al_2O_3$, 2-20% $B_2O_3$, 0-20% ZnO, 0-15% of one or more of oxides selected from BaO, CaO, and SrO; and 0-3% of one or more of oxides selected from $Na_2O$, $K_2O$, $Cs_2O$, $Li_2O$ and mixtures thereof; and wherein the surface area to weight ratio of the conductive metal oxide is in the range of 5 to 15 $m^2/g$; and
   wherein the softening point of said glass binder is in the range 400-600° C.; and
   wherein said composition is characterized by being lead-free.

2. The black conductive composition of claim 1 wherein ruthenium polyoxide is selected from the group consisting of $Bi_2Ru_2O_7$, $Cu_xBi_{2-x}RuO_7$, $GdBiRu_2O_7$, and mixtures thereof.

3. A layer comprising the composition of claim 1 wherein said composition has been processed to remove the organic solvent.

4. A black electrode formed from the black conductive composition of claim 1.

* * * * *